US012765406B2

(12) United States Patent
Kuo et al.

(10) Patent No.: US 12,765,406 B2
(45) Date of Patent: Oct. 13, 2026

(54) METHOD OF FORMING REDISTRIBUTION LAYER STRUCTURE

(71) Applicant: Taiwan Semiconductor Manufacturing Company, Ltd., Hsinchu (TW)

(72) Inventors: Hung-Jui Kuo, Hsinchu City (TW); Hui-Jung Tsai, Hsinchu (TW); Jyun-Siang Peng, Hsinchu City (TW); Chia-Wei Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 724 days.

(21) Appl. No.: 17/871,993

(22) Filed: Jul. 25, 2022

(65) Prior Publication Data

US 2022/0359359 A1 Nov. 10, 2022

Related U.S. Application Data

(62) Division of application No. 16/655,156, filed on Oct. 16, 2019.

(51) Int. Cl.

| | |
|---|---|
| ***H10W 70/685*** | (2026.01) |
| ***H10W 70/05*** | (2026.01) |
| ***H10W 70/60*** | (2026.01) |
| ***H10W 74/10*** | (2026.01) |

(52) U.S. Cl.

CPC ......... *H10W 70/685* (2026.01); *H10W 70/05* (2026.01); *H10W 70/611* (2026.01); *H10W 74/117* (2026.01)

(58) Field of Classification Search

CPC ........... H01L 21/4857; H01L 23/49822; H01L 23/3128; H01L 23/5383

See application file for complete search history.

(56) References Cited

U.S. PATENT DOCUMENTS

| | | | | |
|---|---|---|---|---|
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2015/0325544 | A1* | 11/2015 | Wang | H01J 37/32 134/1.1 |
| 2018/0005939 | A1* | 1/2018 | Hu | H01L 21/76802 |

* cited by examiner

*Primary Examiner* — Joshua Benitez Rosario
*Assistant Examiner* — Christopher A Culbert
(74) *Attorney, Agent, or Firm* — JCIPRNET

(57) ABSTRACT

A conductive structure, a semiconductor package and methods of forming the same are disclosed. A conductive structure includes a metal feature, an insulating layer and a nitridized metal layer. The metal feature is disposed over a substrate and includes a lower metal pattern and an upper metal pattern over the lower metal pattern. The insulating layer surrounds the metal feature. The nitridized metal layer is disposed between the lower metal pattern and the upper metal pattern.

20 Claims, 16 Drawing Sheets

100: 100a,100b,100c,100d,100e,102
200: 200a,200b,200c,200d,200e,202

100:100a,100b,100c,100d,100e,102

100:100a,100b,100c,100d,100e,102

100:100a,100b,100c,100d,100e,102

100:100a,100b,100c,100d,100e,102

100: 100a,100b,100c,100d,100e,102

100: 100a,100b,100c,100d,100e,102

100: 100a,100b,100c,100d,100e,102

100: 100a,100b,100c,100d,100e,102

100: 100a,100b,100c,100d,100e,102

100:100a,100b,100c,100d,100e,102

METHOD OF FORMING REDISTRIBUTION LAYER STRUCTURE

CROSS-REFERENCE TO RELATED APPLICATION

This application is a divisional application of and claims the priority benefit of a prior application Ser. No. 16/655,156, filed on Oct. 16, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Although existing semiconductor packages have been generally adequate for their intended purposes, they have not been entirely satisfactory in all respects.

DETAILED DESCRIPTION

Figure 1:
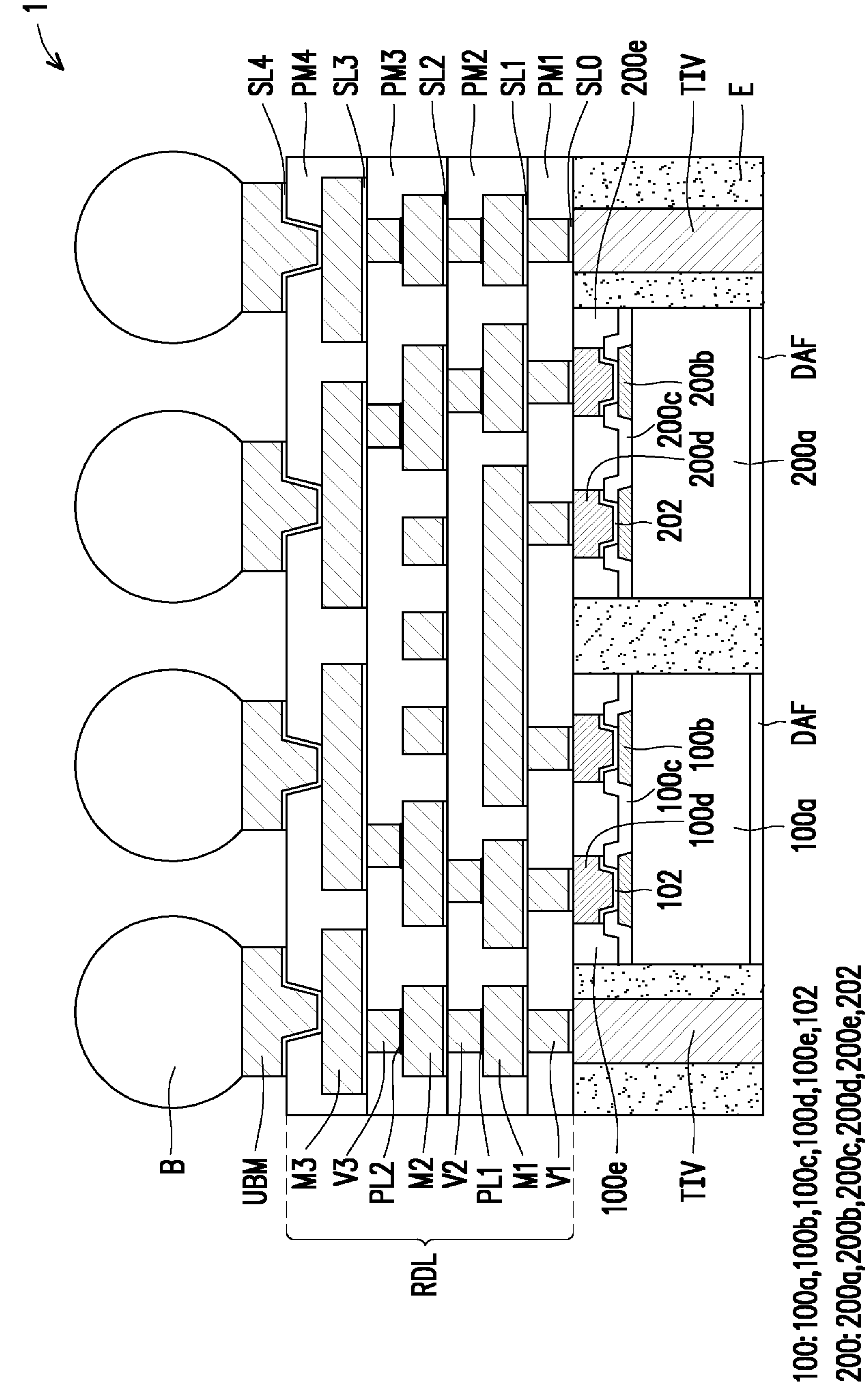
FIG. 1 is a cross-section view of a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
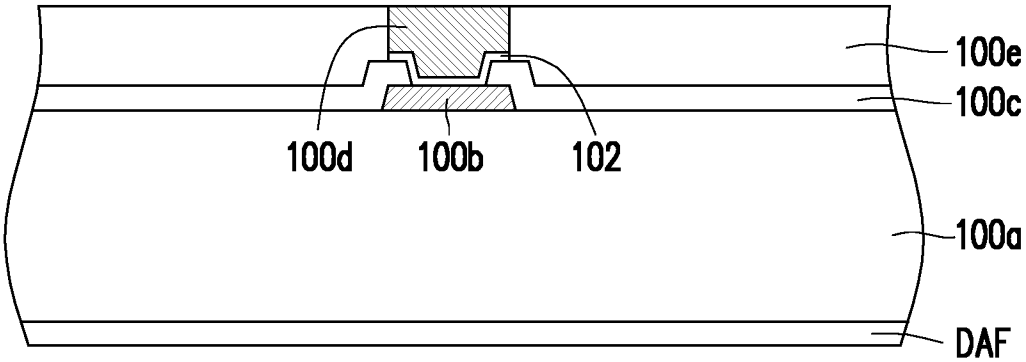
FIG. 2A to FIG. 2O are cross-sectional views showing a method of forming a conductive structure of a semiconductor package in accordance with some embodiments.

FIG. 1 is a cross-section view of a semiconductor package in accordance with some embodiments. FIG. 2A to FIG. 2O are cross-sectional views of a method of forming a conductive structure of a semiconductor package in accordance with some embodiments. In some embodiments, the semiconductor package of FIG. 1 is an integrated fan-out (InFO) package, and the conductive structure is a redistribution layer structure, but the disclosure is not limited thereto. The disclosure may be applied to an integrated fan-in package as needed.

Referring to FIG. 1, a semiconductor package 1 including two dies 100 and 200 is provided. Each of the dies 100 and 200 may be an application-specific integrated circuit (ASIC) chip, an analog chip, a sensor chip, a wireless and radio frequency chip, a voltage regulator chip or a memory chip, for example. In some embodiments, each of the dies 100 and 200 may include an active component or a passive component. In some embodiments, the die 100 and the die 200 may have similar function or size. In alternative embodiments, the die 100 and the die 200 may have different functions or sizes.

In some embodiments, the die 100 includes a substrate 100*a*, at least one pad 100*b* over the substrate 100*a*, a passivation layer 100*c* over the substrate 100*a* and exposing a portion of the pad 100*b*, at least one connector 100*d* over the passivation layer 100*c* and electrically connected to the pad 100*b*, a seed layer 102 between the pad 100*b* and the connector 100*d*, and a protection layer 100*e* over the passivation layer 100*c* and aside the at least one connector 100*d*. The substrate 100*a* may include a bulk silicon substrate, a semiconductor-on-insulator (SOI) substrate or a semiconductor substrate with nanowires or fins. The substrate 100*a* may have a device layer that includes a gate, source/drain regions, an interconnect structure, etc. The pad 100*b* may be electrically connected to the device layer and may include Al. Each of the seed layer 102 and the connector 100*d* includes Cu, Ti, Ta, W, Ru, Co, Ni or an alloy thereof. In some embodiments, the seed layer 102 may include Ti/Cu, and the connector 100*d* may include Cu. Each of the passivation layer 100*c* and the protection layer 100*e* may include a dielectric material such as silicon oxide, silicon nitride or silicon oxynitride, a polymer material such as polybenzoxazole (PBO), polyimide (PI) or benzocyclobutene (BCB), or the like. The passivation layer 100*c* may include a material different from that of the protection layer 100*e*. In some embodiments, the side of the die 100 with the at least one connector 100*d* is referred to as a front side throughout the description. In some embodiments, a die attach film DAF is provided on the backside of the die 100.

In some embodiments, the die 200 has a structure similar to that of the die 100. In some embodiments, the die 200 includes a substrate 200*a*, at least one pad 200*b* over the substrate 200*a*, a passivation layer 200*c* over the substrate 200*a* and exposing a portion of the pad 200*b*, at least one connector 200*d* over the passivation layer 200*c* and electrically connected to the pad 200*b*, a seed layer 202 between the pad 200$b$ and the connector 200$d$, and a protection layer 200$e$ over the passivation layer 200$c$ and aside the at least one connector 200$d$. The materials of components of the die 200 are similar to those of the die 100, so the details are not iterated herein. In some embodiments, the side of the die 200 with the at least one connector 200$d$ is referred to as a front side throughout the description. In some embodiments, a die attach film DAF is provided on the backside of the die 200.

In some embodiments, a dielectric encapsulation E is further included in the semiconductor package 1. The dielectric encapsulation E is disposed aside and between the dies 100 and 200. The dielectric encapsulation E surrounds the dies 100 and 200, and exposes the surfaces of the connectors 100$d$ and 200$d$. The dielectric encapsulation E includes a molding compound such as epoxy, a photo-sensitive material such as polybenzoxazole (PBO), polyimide (PI) or benzocyclobutene (BCB), the like, or a combination thereof. In some embodiments, through integrated fan-out vias TIV are formed through the dielectric encapsulation E and aside the dies 100 and 200 for providing electrical connection between the die(s) and other metal features.

In some embodiments, one or more metal vias V1 are further included in the semiconductor package 1. The metal vias V1 are disposed over and electrically connected to the dies 100 and 200. Specifically, the metal vias V1 are electrically connected to the connectors 100$d$ and 200$d$ of the dies 100 and 200. In some embodiments, a seed layer SL0 is disposed between each metal via V1 and the corresponding connector 100$d$ or 200$d$. The seed layer may provide an optimum nucleation rate or a special growth direction for the subsequently formed metal feature. In some embodiments, the seed layer includes a metallic element the same as that of the subsequently formed metal feature. Through the specification, the seed layer not only serves as a seed for the subsequently formed metal feature, but also provides adhesion between adjacent metal features. Specifically, the seed layer SL0 not only serves as a seed for the subsequently formed via V1, but also provides adhesion between the metal via V1 and the underlying connector 100$d$ or 200$d$. In some embodiments, each of the seed layer SL0 and the metal via V1 includes Cu, Ti, Ta, W, Ru, Co, Ni or an alloy thereof. In some embodiments, the seed layer SL0 may include Ti/Cu, and the metal via V1 may include Cu. In some embodiments, the edge of the seed layer SL0 is aligned with the edge of the metal via V1, but the present disclosure is not limited thereto. In alternative embodiments, the edge of the seed layer SL0 is not aligned (e.g., protruded from) the edge of the metal via V1.

In some embodiments, a polymer layer PM1 is further included in the semiconductor package 1. In some embodiments, the polymer layer PM1 is disposed over the die 100, the die 200 and the dielectric encapsulation E, and surrounds the metal via V1 and the underlying seed layer SL0. In some embodiments, the polymer layer PM1 includes polybenzoxazole (PBO), polyimide (PI), benzocyclobutene (BCB), the like, or a combination thereof. In some embodiments, the polymer layer PM1 is a single layer, but the disclosure is not limited thereto. In alternative embodiments, the polymer layer PM1 has a multi-layer structure.

In some embodiments, a metal line M1 is further included in the semiconductor package 1. The metal line M1 is disposed over and electrically connected to the metal vias V1 and therefore the die 100 and the die 200. In some embodiments, a seed layer SL1 is disposed between the metal line M1 and the corresponding metal via V1 and between the metal line M1 and the polymer layer PM1. In some embodiments, each of the seed layer SL1 and the metal line M1 includes Cu, Ti, Ta, W, Ru, Co, Ni or an alloy thereof. In some embodiments, the seed layer SL1 may include Ti/Cu, and the metal line M1 may include Cu. In some embodiments, the edge of the seed layer SL1 is aligned with the edge of the metal line M1, but the present disclosure is not limited thereto. In alternative embodiments, the edge of the seed layer SL1 is not aligned (e.g., protruded from) the edge of the metal line M1.

In some embodiments, one or more metal vias V2 are further included in the semiconductor package 1. The metal vias V2 are disposed over and electrically connected to the metal line M1. In some embodiments, each metal via V2 includes Cu, Ti, Ta, W, Ru, Co, Ni or an alloy thereof.

In some embodiments, a metal protection layer PL1 is disposed between each metal via V2 and the metal line M1. The metal protection layer PL1 is configured to protect the metal line M1 from being damaged by the by-products of the bottom anti-reflection coating (BARC) removal process during the metal line M1 defining step, which will be described in more detail later. Besides, the metal protection layer PL1 functions as a seed layer for the subsequently formed metal via V2. In some embodiments, the metal protection layer PL1 includes a material different from that of the seed layer SL1. In some embodiments, the metal protection layer PL1 includes nitridized metal, such as nitridized copper, nitridized titanium, nitridized tantalum, nitrided tungsten, nitridized ruthenium, nitridized cobalt, nitridized nickel or the like. In some embodiments, the edge of the metal protection layer PL1 is aligned with the edge of the metal via V2, but the present disclosure is not limited thereto. In alternative embodiments, the edge of the metal protection layer PL1 is not aligned (e.g., protruded from) the edge of the metal via V2.

In some embodiments, the metal protection layer PL1 has a thickness different from (e.g., less than) the thickness of the seed layer SL1. For example, the thickness of the seed layer SL1 is at least 5 times or 10 times the thickness of the metal protection layer PL1. In some embodiments, the seed layer SL1 has a thickness of 50 nm to 1000 nm, and the metal protection layer PL1 has a thickness of 0.1 nm to 200 nm.

In some embodiments, a polymer layer PM2 is further included in the semiconductor package 1. In some embodiments, the polymer layer PM2 is disposed over the polymer layer PM1 and surrounds the metal via V2 and the underlying metal protection layer PL1 as well as the metal line M1 and the underlying seed layer SL1. In some embodiments, the polymer layer PM2 includes polybenzoxazole (PBO), polyimide (PI), benzocyclobutene (BCB), the like, or a combination thereof. In some embodiments, the polymer layer PM2 is a single layer, but the disclosure is not limited thereto. In alternative embodiments, the polymer layer PM2 has a multi-layer structure.

In some embodiments, a metal line M2 is further included in the semiconductor package 1. The metal line M2 is disposed over the polymer layer PM2 and electrically connected to the metal vias V2 and therefore the metal line M1. In some embodiments, a seed layer SL2 is disposed between the metal line M2 and the corresponding metal via V2 and between the metal line M2 and the polymer layer PM2. In some embodiments, each of the seed layer SL2 and the metal line M2 includes Cu, Ti, Ta, W, Ru, Co, Ni or an alloy thereof. In some embodiments, the seed layer SL2 may include Ti/Cu, and the metal line M2 may include Cu. In some embodiments, the edge of the seed layer SL2 is aligned with the edge of the metal line M2, but the present disclosure is not limited thereto. In alternative embodiments, the edge of the seed layer SL2 is not aligned (e.g., protruded from) the edge of the metal line M2.

In some embodiments, one or more metal vias V3 are further included in the semiconductor package 1. The metal vias V3 are disposed over and electrically connected to the metal line M2. In some embodiments, each metal via V3 includes Cu, Ti, Ta, W, Ru, Co, Ni or an alloy thereof.

In some embodiments, a metal protection layer PL2 is disposed between each metal via V3 and the metal line M2. The metal protection layer PL2 is configured to protect the metal line M2 from being damaged by the by-products of the bottom anti-reflection coating (BARC) removal process during the metal line M2 defining step, which will be described in more detail later. Besides, the metal protection layer PL2 functions as a seed layer for the subsequently formed metal via V3. In some embodiments, the metal protection layer PL2 includes a material different from that of the seed layer SL2. In some embodiments, the metal protection layer PL2 includes nitridized metal, such as nitridized copper, nitridized titanium, nitridized tantalum, nitrided tungsten, nitridized ruthenium, nitridized cobalt, nitridized nickel or the like. In some embodiments, the edge of the metal protection layer PL2 is aligned with the edge of the metal via V3, but the present disclosure is not limited thereto. In alternative embodiments, the edge of the metal protection layer PL2 is not aligned (e.g., protruded from) the edge of the metal via V3.

In some embodiments, the metal protection layer PL2 has a thickness different from (e.g., less than) the thickness of the seed layer SL2. For example, the thickness of the seed layer SL2 is at least 5 times or 10 times the thickness of the metal protection layer PL2. In some embodiments, the seed layer SL2 has a thickness of 50 nm to 1000 nm, and the metal protection layer PL2 has a thickness of 0.1 nm to 200 nm.

In some embodiments, a polymer layer PM3 is further included in the semiconductor package 1. In some embodiments, the polymer layer PM3 is disposed over the polymer layer PM2 and surrounds the metal via V3 and the underlying metal protection layer PL2 as well as the metal line M2 and the underlying seed layer SL2. In some embodiments, the polymer layer PM3 includes polybenzoxazole (PBO), polyimide (PI), benzocyclobutene (BCB), the like, or a combination thereof. In some embodiments, the polymer layer PM3 is a single layer, but the disclosure is not limited thereto. In alternative embodiments, the polymer layer PM3 has a multi-layer structure.

In some embodiments, a metal line M3 is further included in the semiconductor package 1. The metal line M3 is disposed over the polymer layer M3 and electrically connected to the metal vias V3 and therefore the metal line M2. In some embodiments, a seed layer SL3 is disposed between the metal line M3 and the corresponding metal via V3 and between the metal line M3 and the polymer layer PM3. In some embodiments, each of the seed layer SL3 and the metal line M3 includes Cu, Ti, Ta, W, Ru, Co, Ni or an alloy thereof. In some embodiments, the seed layer SL3 may include Ti/Cu, and the metal line M3 may include Cu. In some embodiments, the edge of the seed layer SL3 is aligned with the edge of the metal line M3, but the present disclosure is not limited thereto. In alternative embodiments, the edge of the seed layer SL3 is not aligned (e.g., protruded from) the edge of the metal line M3.

In some embodiments, a polymer layer PM4 is further included in the semiconductor package 1. In some embodiments, the polymer layer PM4 is disposed over the polymer layer PM3 aside the metal line M3 and exposes a part of the metal line M3. In some embodiments, the polymer layer PM4 includes polybenzoxazole (PBO), polyimide (PI), benzocyclobutene (BCB), the like, or a combination thereof. In some embodiments, the polymer layer PM4 is a single layer, but the disclosure is not limited thereto. In alternative embodiments, the polymer layer PM4 has a multi-layer structure.

In some embodiments, under bump metallization pads UBM are further included in the semiconductor package 1. The under bump metallization pads UBM are disposed over and electrically connected to the metal line M3. In some embodiments, a seed layer SL4 is disposed between the under bump metallization pad UBM and the polymer layer PM4 and between the under bump metallization pad UBM and the metal line M3. In some embodiments, each of the seed layer SL4 and the under bump metallization pad UBM includes Cu, Ti, Ta, W, Ru, Co, Ni or an alloy thereof. In some embodiments, the seed layer SL4 may include Ti/Cu, and the under bump metallization pad UBM may include Cu. In some embodiments, the edge of the seed layer SL4 is aligned with the edge of the under bump metallization pad UBM.

A redistribution layer structure RDL of the disclosure is thus provided. In some embodiments, the redistribution layer structure RDL includes the metal vias V1, V2 and V3, the metal lines M1, M2 and M3, the seed layers SL0, SL1, SL2 and SL3, and metal protection layers PL1 and PL2. In some embodiments, the redistribution layer structure RDL optionally includes the bump metallization pads UBM and the underlying seed layers SL4.

In some embodiments, bumps B are further included in the semiconductor package 1. The bumps B are disposed over and electrically connected to the under bump metallization pads UBM. In some embodiments, the bumps B include copper, solder, nickel or a combination thereof.

The structures of the disclosure are illustrated below with reference to FIG. 1. In some embodiments, the present disclosure provides a conductive structure that includes a metal feature, an insulating layer and a nitridized metal layer. In some embodiments, the conductive structure is a part of a redistribution layer structure RDL. The metal feature is disposed over a substrate 100*a* and includes a lower metal pattern (e.g., metal line M1) and an upper metal pattern (e.g., metal via V2) over the lower metal pattern, the insulating layer (e.g., polymer layer PM2) surrounds the metal feature, and the nitridized metal layer (e.g., metal protection layer PL1) is disposed between the lower metal pattern (e.g., metal line M1) and the upper metal pattern (e.g., metal via V2). The insulating layer (e.g., polymer layer PM2) may be a single layer. Similarly, the metal feature is disposed over a substrate 100*a* and includes a lower metal pattern (e.g., metal line M2) and an upper metal pattern (e.g., metal via V3) over the lower metal pattern, the insulating layer (e.g., polymer layer PM3) surrounds the metal feature, and the nitridized metal layer (e.g., metal protection layer PL2) is disposed between the lower metal pattern (e.g., metal line M2) and the upper metal pattern (e.g., metal via V3). The insulating layer (e.g., polymer layer PM2) may be a single layer.

In some embodiments, the dimension of the lower metal pattern is different from the dimension of the upper metal pattern. For example, the dimension of the lower metal pattern (e.g., metal line M1 or M2) is greater than the upper metal pattern (e.g., metal via V2 or V3). However, the present disclosure is not limited thereto. In alternative embodiments, the dimension of the lower metal pattern may be substantially the same as the dimension of the upper metal pattern. For example, the lower pattern may be a lower metal via, and the upper pattern may be an upper metal via, and the lower metal via and the upper via are provided with a similar size.

In some embodiments, the edge of the nitridized metal layer (e.g., metal protection layer PL1 or PL2) is aligned with the edge of the upper metal pattern (e.g., metal via V2 or V3). In some embodiments, the nitridized metal layer is in physical contact with the lower metal pattern (e.g., metal line M2 or M3) and the upper metal pattern (e.g., metal via V2 or V3).

In some embodiments, the nitridized metal layer (e.g., metal protection layer PL1 or PL2) has a thickness of about 0.1 nm to about 100 nm, such as 1 nm, 5 nm, 10 nm, 15 nm, 20 nm, 30 nm, 40 nm, 50 nm, 60 nm, 70 nm, 80 nm or 90 nm, including any range between any two of the preceding values. The nitridized metal layer (e.g., metal protection layer PL1 or PL2) may have a thickness of more than any one of the preceding values.

In some embodiments, the nitridized metal layer (e.g., metal protection layer PL1 or PL2) includes nitridized copper, nitridized titanium, nitridized tantalum, nitrided tungsten, nitridized ruthenium, nitridized cobalt or nitridized nickel. In some embodiments, the nitridized metal layer (e.g., metal protection layer PL1 or PL2) has a nitrogen atom content of about 1-30 at %, such as 5 at %, 10 at %, 15 at %, 20 at % or 25 at %, including any range between any two of the preceding values. In alternative embodiments, the nitridized metal layer (e.g., metal protection layer PL1 or PL2) may have a nitrogen atom content of greater than zero and less than any one of the preceding values. In yet alternative embodiments, the nitridized metal layer (e.g., metal protection layer PL1 or PL2) may have a nitrogen atom content of more than any one of the preceding values.

In some embodiments, the present disclosure further provides a semiconductor package that includes at least one die 100 and a redistribution layer structure RDL. The redistribution layer structure RDL is disposed over and electrically to the at least one die 100 or and includes at least one metal feature. In some embodiments, the at least one metal feature includes a lower seed layer SL1, a metal line M1, an upper seed layer (e.g., metal protection layer PL1) and a metal via V2 sequentially stacked and embedded by a polymer layer PM2, and the lower seed layer SL1 and the upper seed layer (e.g., metal protection layer PL1) include different materials. Similarly, the at least one metal feature includes a lower seed layer SL2, a metal line M2, an upper seed layer (e.g., metal protection layer PL2) and a metal via V3 sequentially stacked and embedded by a polymer layer PM3, and the lower seed layer SL2 and the upper seed layer (e.g., metal protection layer PL2) include different materials.

In some embodiments, the lower seed layer SL1 or SL2 includes a metallic element, and the upper seed layer (e.g., metal protection layer PL1 or PL2) includes an metallic element and a non-metallic element. In some embodiments, the lower seed layer SL1 or SL2 includes titanium and copper, and the upper seed layer (e.g., metal protection layer PL1 or PL2) includes nitridized metal such as nitridized copper. In some embodiments, the upper seed layer (e.g., metal protection layer PL1 or PL2) includes has a nitrogen atom content of about 1-30 at %.

In some embodiments, the lower seed layer SL1 or SL2 is thicker than the upper seed layer (e.g., metal protection layer PL1 or PL2). In some embodiments, the thickness of the lower seed layer SL1 or SL2 is at least 5 times or 10 times the thickness of the upper seed layer (e.g., metal protection layer PL1 or PL2). In some embodiments, the seed layer SL1 or SL2 has a thickness of 50 nm to 1000 nm, and the upper seed layer (e.g., metal protection layer PL1 or PL2) has a thickness of 0.1 nm to 100 nm. However, the present disclosure is not limited thereto. In alternative embodiments, the lower seed layer SL1 or SL2 may be as thick as the upper seed layer (e.g., metal protection layer PL1 or PL2). In yet alternative embodiments, the lower seed layer SL1 or SL2 may be less than the upper seed layer (e.g., metal protection layer PL1 or PL2).

The method of forming the conductive structure (e.g., redistribution layer structure RDL) of the semiconductor package in FIG. 1 is locally illustrated in FIG. 2A to FIG. 2O in the following. It is understood that the disclosure is not limited by the method described below. Additional operations can be provided before, during, and/or after the method and some of the operations described below can be replaced or eliminated, for additional embodiments of the methods.

Although FIG. 2A to FIG. 2O are described in relation to a method, it is appreciated that the structures disclosed in FIG. 2A to FIG. 2O are not limited to such a method, but instead may stand alone as structures independent of the method.

Referring to FIG. 2A, at least one die 100 is placed on a carrier (not shown). The die 100 has a substrate 100*a*, at least one pad 100*b* over the substrate 100*a*, a passivation layer 100*c* over the substrate 100*a*, at least one connector 100*d* over the passivation layer 100*c* and electrically connected to the pad 100*b*, a seed layer 102 between the pad 100*b* and the connector 100*d*, and a protection layer 100*e* over the passivation layer 100*c* and aside the connector 100*d*. In some embodiment, a die attach film DAF is provided on the backside of the die 100 and attached to the carrier.

Figure 2B:
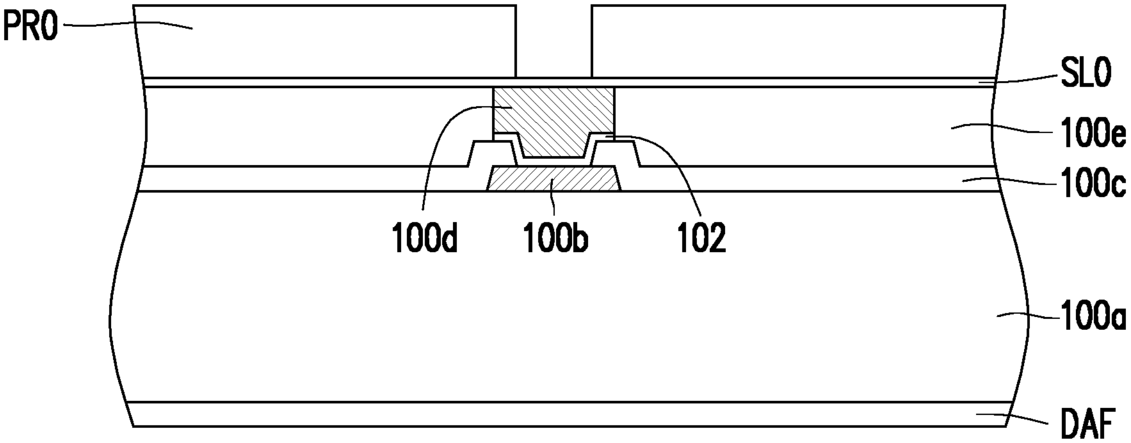

Referring to FIG. 2B, a seed layer SL0 is formed over the connector 100*d* and the protection layer 100*e*. Specifically, the seed layer SL0 is formed on the entire surface of the protection layer 100*e* and in physical contact with the top surface of the connector 100*d*. In some embodiments, the seed layer SL0 includes Ti/Cu, and is formed by a sputtering process or a suitable method.

A photoresist layer PR0 is then formed on the seed layer SL0. In some embodiments, the photoresist layer PR0 is a dry film resist (DFR) over the die 100 and has at least one opening that exposes the intended location for the subsequently formed metal via V1. The opening of the photoresist layer PR0 exposes a portion of the seed layer SL0.

Figure 2C:
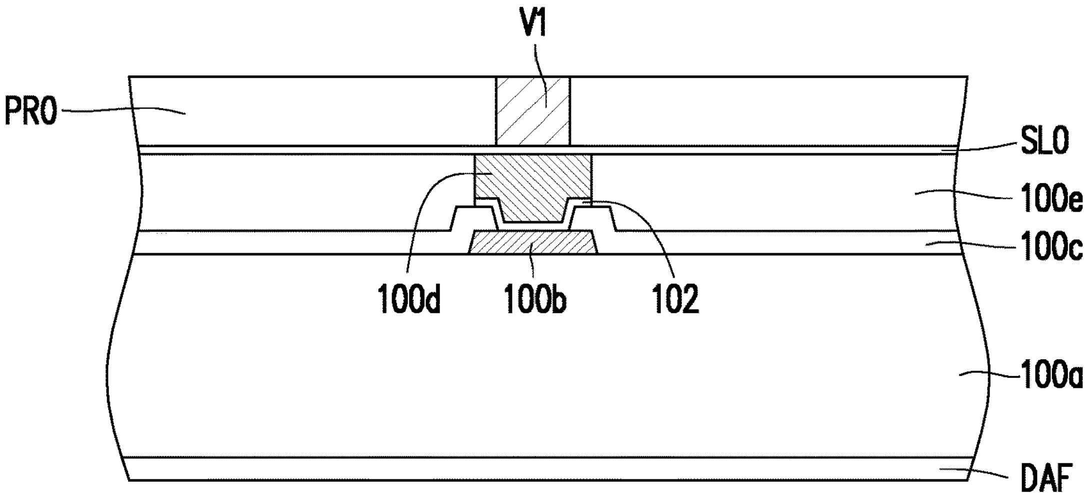

Referring to FIG. 2C, a metal via V1 is formed in the opening of the photoresist layer PR0. In some embodiments, the method of forming the metal via V1 includes performing an electroplating process. In some embodiments, the metal via V1 is plated in the opening of the photoresist layer PR0 by using the seed layer SL0 as a seed. In some embodiments, the metal via V1 may include Cu.

Figure 2D:
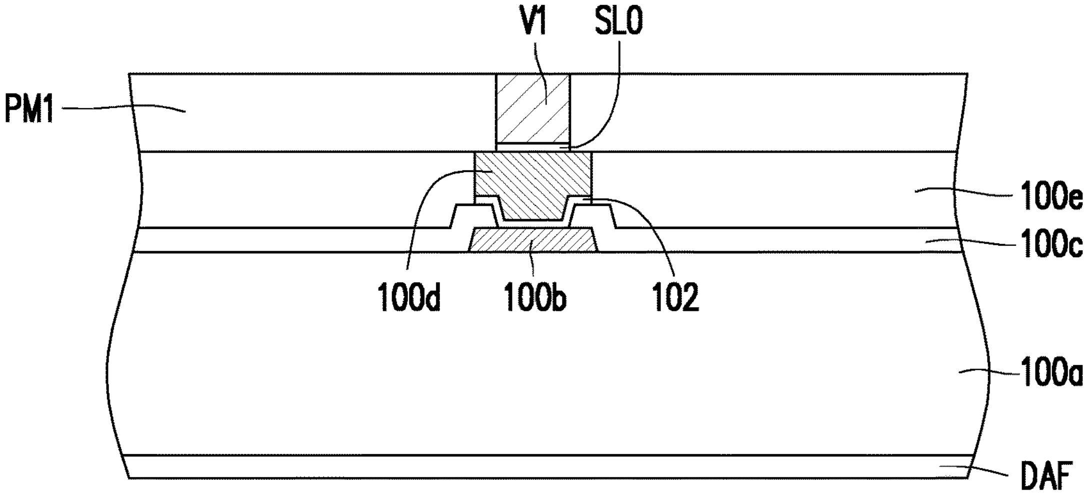

Referring to FIG. 2D, the photoresist layer PR0 and the underlying seed layer SL0 are removed. In some embodiments, the photoresist layer PR0 is removed, and then the seed layer SL0 is partially removed by using the metal via V1 as a mask. Therefore, the remaining seed layer SL0 is between the metal via V1 and the corresponding connector 100*d*.

Thereafter, a polymer layer PM1 is formed over the protection layer 100*e* and aside the metal via V1. The top surface of the polymer layer PM1 is substantially coplanar with top surface of the metal via V1.

Figure 2E:
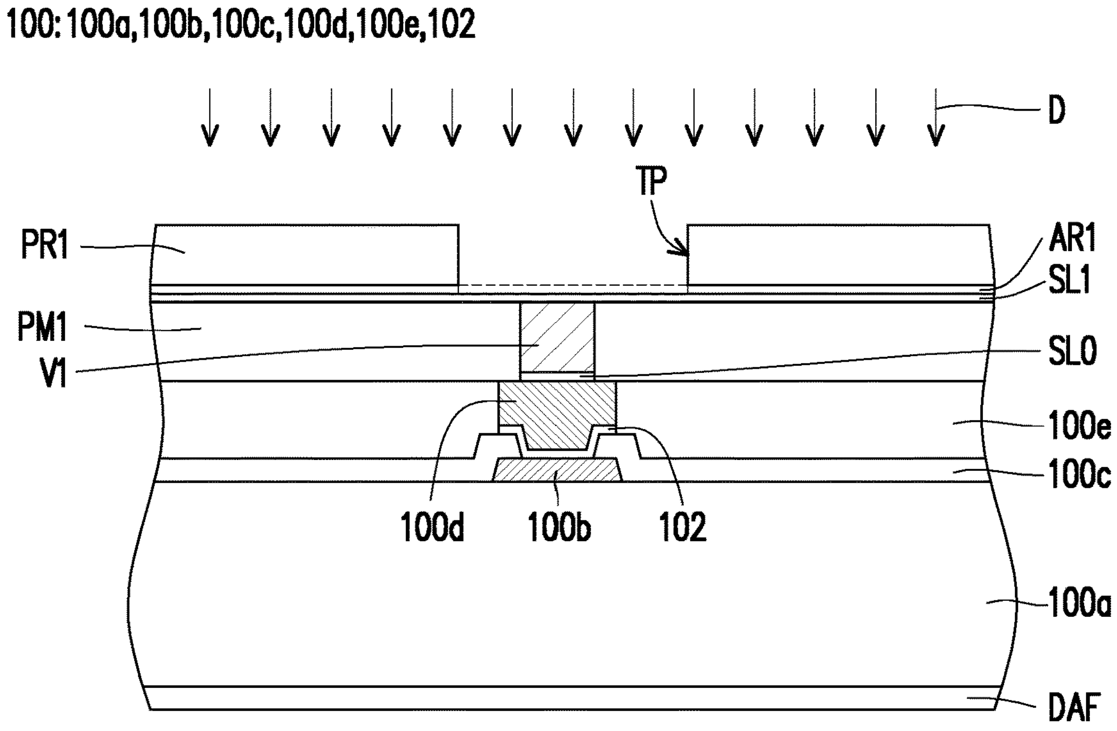

Referring to FIG. 2E, a seed layer SL1 is formed over the metal via V1 and the polymer layer PM1. Specifically, the seed layer SL1 is formed on the entire surface of the polymer layer PM1 and in physical contact with the top surface of the metal via V1. In some embodiments, the seed layer SL1 includes Ti/Cu, and is formed by a sputtering process or a suitable method.

Thereafter, a bottom anti-reflection coating layer AR1 is formed over the seed layer SL1. The bottom anti-reflection coating (BARC) material is configured to effectively reduce reflection from the upper photoresist surface as well as the surface of the underlying materials. In some embodiments, the bottom anti-reflection coating layer AR1 is formed by a coating process or a suitable method.

Afterwards, a photoresist layer PR1 is formed on the bottom anti-reflection coating layer AR1. In some embodiments, the photoresist layer PR1 is a dry film resist (DFR) over the polymer layer PM1 and has an open area that exposes the intended location for the subsequently formed metal line M1. In some embodiments, the photoresist layer PR1 has at least one trench pattern TP that exposes a portion of the bottom anti-reflection coating layer AR1.

Next, a descum process D is performed to the photoresist layer PR1, so as to remove any residual photoresist remaining on the open area after development, and remove the bottom anti-reflection coating layer AR1 from the open area. In some embodiments, the descum process D is accomplished using an oxygen-containing plasma. In some embodiments, the oxygen-containing plasma includes oxygen ($O_2$), ozone ($O_3$), nitrous oxide ($N_2O$), the like or combination thereof. The oxygen-containing plasma may be diluted with an inert gas, such as argon (Ar), helium (He), neon (Ne), or a mixture thereof. Specifically, the descum process D removes the exposed portion of the bottom anti-reflection coating layer AR1, so that the trench pattern TP of the photoresist layer PR1 exposes a portion of the seed layer SL1.

Figure 2F:
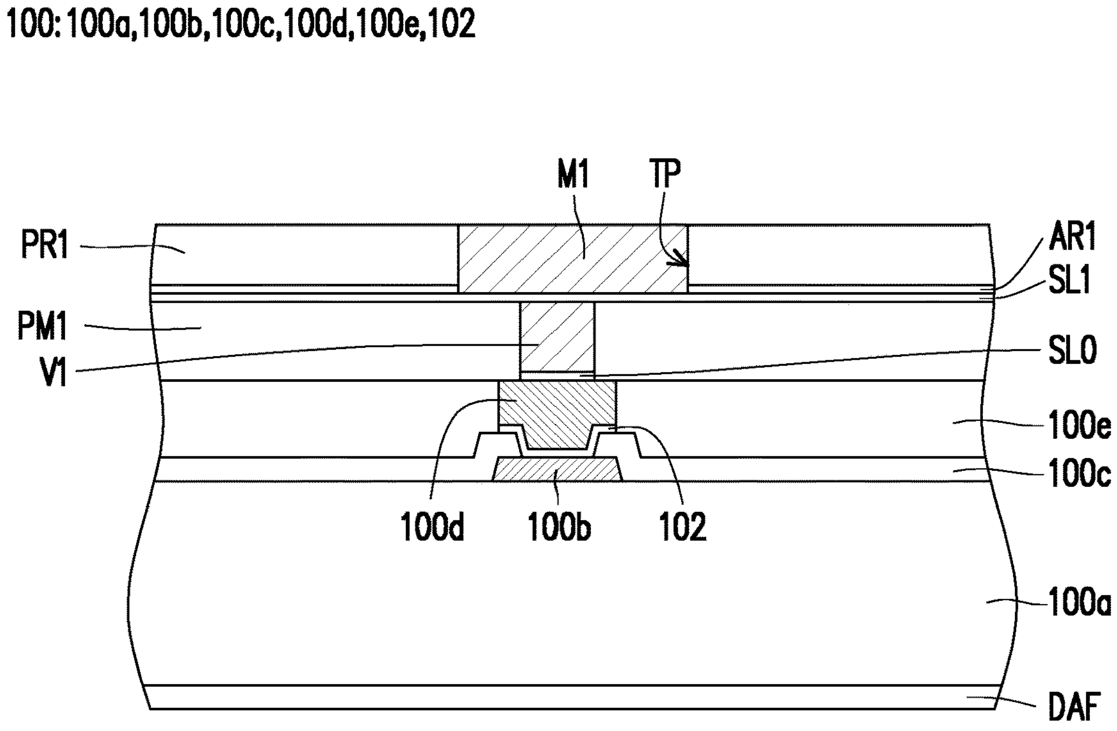

Referring to FIG. 2F, a metal line M1 is formed in the trench pattern TR of the photoresist layer PR1 by using the exposed seed layer SL1 as a seed. In some embodiments, the metal line M1 includes Cu, and the forming method thereof includes performing an electroplating process.

Figure 2G:
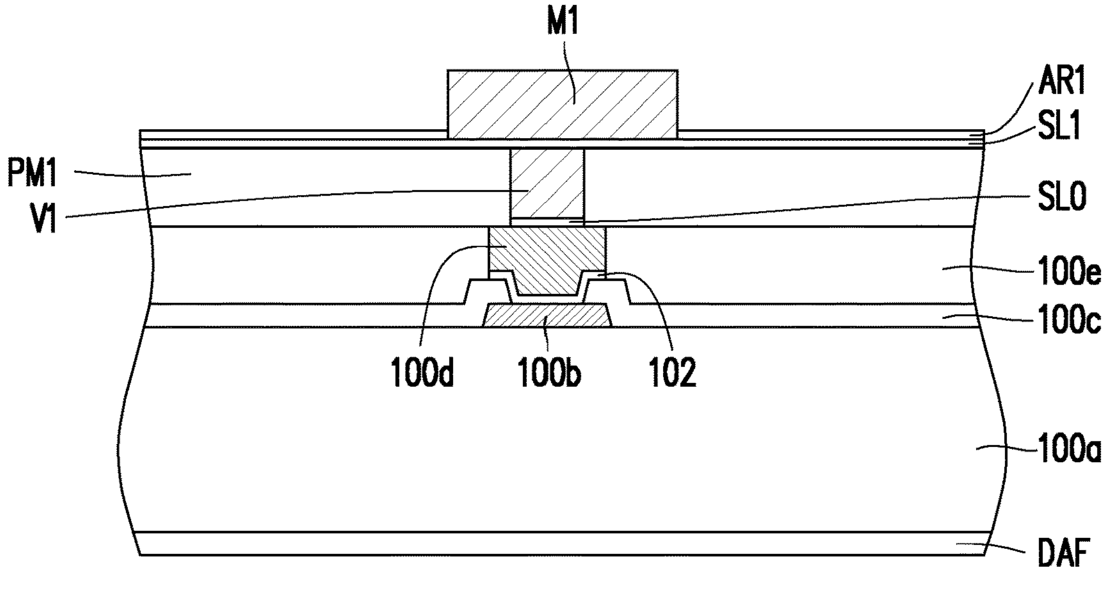

Referring to FIG. 2G, the photoresist layer PR1 is removed. In some embodiments, the photoresist layer PR1 is removed by a wet etching process. Specifically, the photoresist layer PR1 is removed without removing the underlying bottom anti-reflection coating layer AR1.

After the photoresist layer PR1 is removed, the bottom anti-reflection coating layer AR1 is subjected to a removing process. However, with the conventional removing process, the by-products (e.g., chorine-containing by-products generated by the reaction of BARC and oxygen) of the BARC removal process usually damages the underlying metal. Accordingly, the removal of the BARC material without damaging the underlying metal proves to be challenging. On the contrary, such issue is not observed in the disclosure. The disclosure provides a novel process that not only can effectively remove the BARC material but also can form a metal protection layer over the exposed metal feature, which will be described in the following.

Figure 2H:
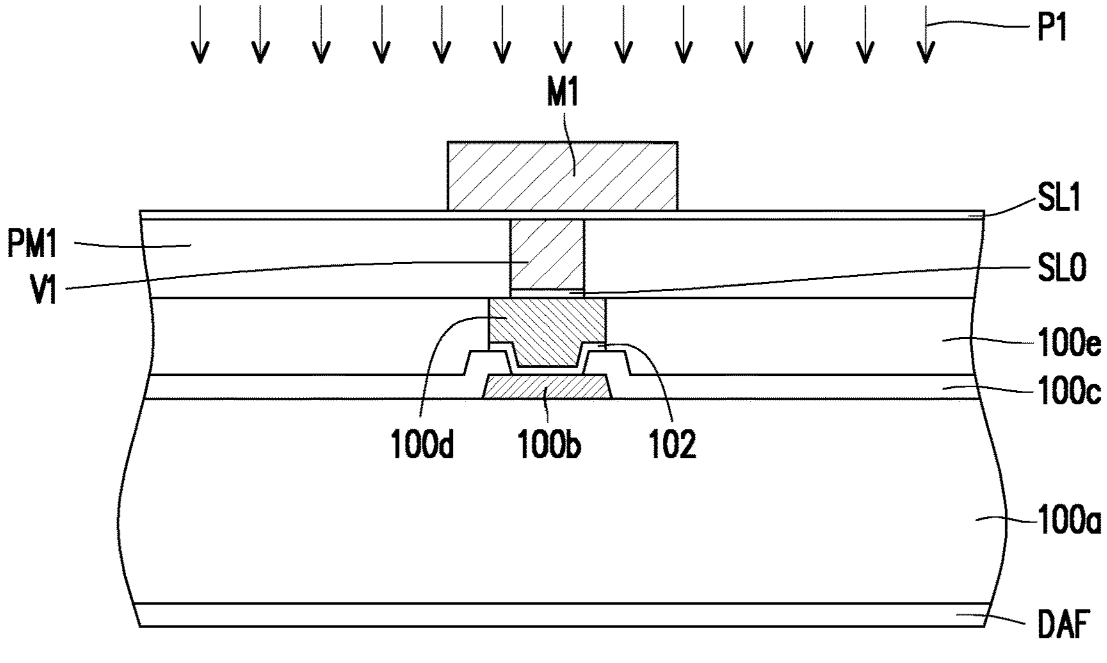

Referring to FIG. 2H, the bottom anti-reflection coating layer AR1 is removed. In some embodiments, the method of removing the bottom anti-reflection coating layer AR1 includes performing an oxygen-containing plasma P1. In some embodiments, the oxygen-containing plasma includes oxygen ($O_2$), ozone ($O_3$), nitrous oxide ($N_2O$), the like or combination thereof. The oxygen-containing ambient may be diluted with an inert gas, such as argon (Ar), helium (He), neon (Ne), or a mixture thereof. The bottom anti-reflection coating layer AR1 may be reacted with oxygen to generate by-products, and the by-products may be removed by argon. In some embodiments, the amount of argon is greater than the amount of oxygen, so as to effectively remove the by-products and therefore prevent the underlying layer (e.g., metal line M1) from being damaged by the by-products. However, the present disclosure is not limited thereto. The amount of argon may be equal to or less than the amount of oxygen as needed. In some embodiments, the oxygen-containing plasma P1 includes a dilute gas (e.g., argon) and an oxygen-containing gas (e.g., oxygen), and the volume ratio of the dilute gas to the oxygen-containing gas ranges from about 1:10 to about 10:1, such as 1:9, 1:8, 1:7, 1:6, 1:5, 1:4, 1:3, 1:2, 1:1, 2:1, 3:1, 4:1, 5:1, 6:1, 7:1, 8:1 or 9:1, including any range between any two of the preceding values. The volume ratio of the dilute gas to the oxygen-containing gas may be greater than any one of the preceding values.

Besides, the plasma reactor control parameters such as chamber temperature, process time, power, chamber pressure, gas flow rate and the like) may be selected before processing the oxygen-containing plasma P1. In some embodiments, the oxygen-containing plasma P1 includes a chamber temperature of 20 to 100° C., a process time to 10 to 3,600 seconds, a power of 10 to 5,000 W, an oxygen flow rate of 1 to 2,000 sccm, and a chamber pressure of 0.01 to 200 Pa.

Figure 2I:
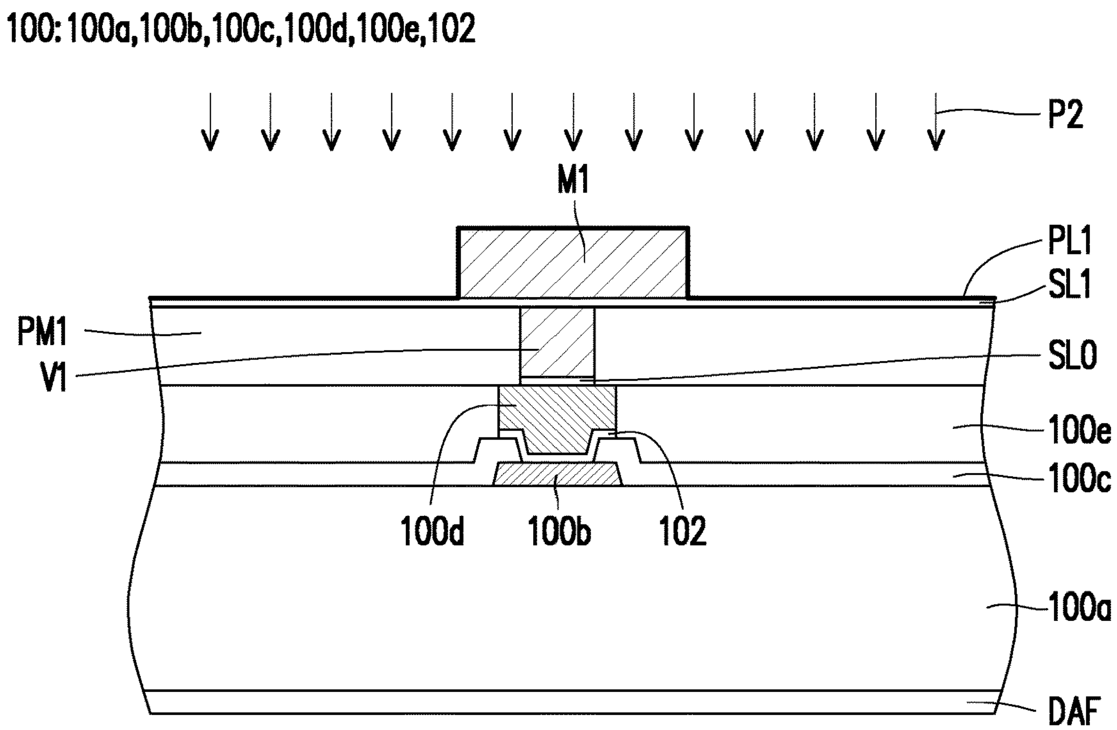

Referring to FIG. 2I, a metal protection layer PL1 is formed on the surface of the metal line M1. In some embodiments, the method of forming the metal protection layer PL1 includes performing a nitrogen-containing plasma P2. The operation in FIG. 2I may be referred to as a nitridation process, a nitrogen treatment, a plasma nitridization procedure or a nitrogen plasma implantation in some examples. Specifically, the nitrogen-containing plasma P2 is performed to the metal line M1 and the seed layer SL1 aside the metal line M1, and thus, the metal protection layer PL1 is formed on the top surface and the sidewall of the metal line M1 and on the top surface of the seed layer SL1.

In some embodiments, the nitrogen-containing plasma P2 includes $N_2$, $NH_3$, $NH_4$, NHx (wherein x is between 0 and 1), the like or combination thereof. In some embodiments, the nitrogen-containing plasma P2 is a pure nitrogen gas. In alternative embodiments, the nitrogen-containing ambient may be diluted with an inert gas such as, for example, argon (Ar), helium (He), neon (Ne), or a mixture thereof. The surface portions of the exposed metal features (e.g., metal line M1 and the seed layer SL1) may be reacted with nitrogen to form a nitridized metal layer, and the residual by-products remaining, if any, may be removed by argon. In some embodiments, the amount of nitrogen is greater than the amount of argon, so as to effectively form the metal protection layer PL1. In some embodiments, the nitrogen-containing plasma P1 includes a dilute gas (e.g., argon) and a nitrogen-containing gas (e.g., nitrogen), and the volume ratio of the dilute gas to the nitrogen-containing gas ranges from about 1:1 to about 1:20, such as 1:2, 1:3, 1:4, 1:5, 1:6, 1:7, 1:8, 1:9, 1:10, 1:11, 1:12, 1:13, 1:14, 1:15, 1:16, 1:17, 1:18 or 1:19, including any range between any two of the preceding values. The volume ratio of the dilute gas to the nitrogen-containing gas may be less than any one of the preceding values.

Besides, the plasma reactor control parameters such as chamber temperature, process time, power, chamber pressure, gas flow rate and the like) may be selected before processing the nitrogen-containing plasma P2. In some embodiments, the nitrogen-containing plasma P2 includes a chamber temperature of 20 to 150° C., a process time to 10 to 3,600 seconds, a power of 10 to 5,000 W, a nitrogen flow rate of 1 to 2,000 sccm, and a chamber pressure of 0.01 to 200 Pa.

From another point of view, notwithstanding whether the nitrogen-containing ambient is employed neat (i.e., non-diluted) or diluted, the content of nitrogen within the nitrogen-containing ambient employed in the present disclosure is typically from 50% to 100%. The metal protection layer PL1 is formed by nitridizing the metal surface with the nitrogen-containing plasma. In some embodiments, the metal protection layer PL1 includes nitridized metal, such as nitridized copper, nitridized titanium, nitridized tantalum, nitrided tungsten, nitridized ruthenium, nitridized cobalt, nitridized nickel or the like. In some embodiments, the metal protection layer PL1 includes a nitrogen atom content of about 1-30 at %.

Figure 2J:
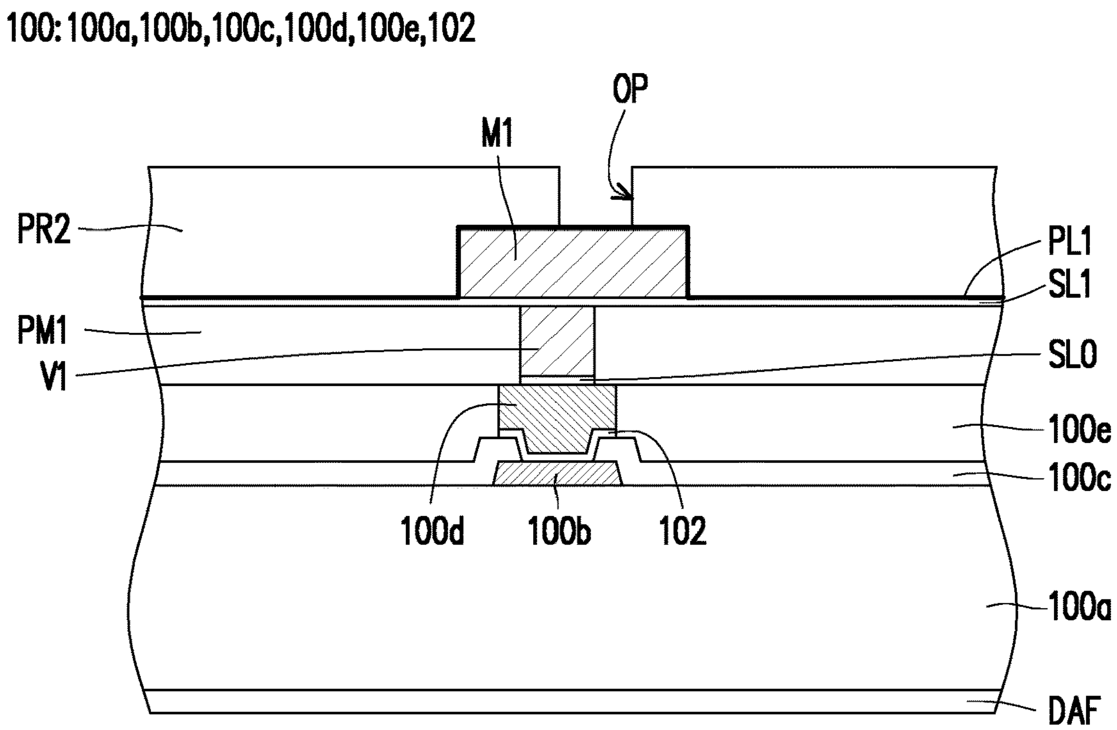

Referring to FIG. 2J, a photoresist layer PR2 is formed on the metal protection layer PL1. In some embodiments, the photoresist layer PR2 is a dry film resist (DFR) over the polymer layer PM1 and has an open area that exposes the intended location for the subsequently formed metal via V2. In some embodiments, the photoresist layer PR2 has at least one opening pattern OP that exposes a portion of the metal protection layer PL1.

Figure 2K:
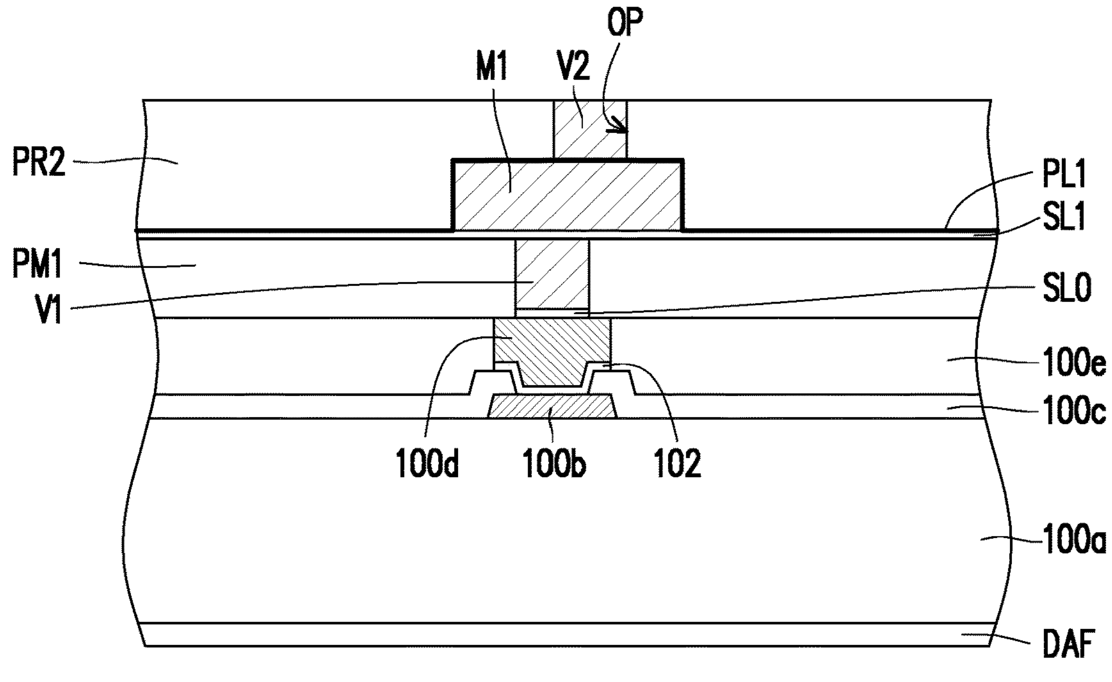

Referring to FIG. 2K, a metal via V2 is formed in the opening pattern OP of the photoresist layer PR2. The metal via V2 may include Cu. In some embodiments, an electroplating process is performed to form the metal via V2 by using the metal protection layer PL1 as a seed.

Figure 2L:
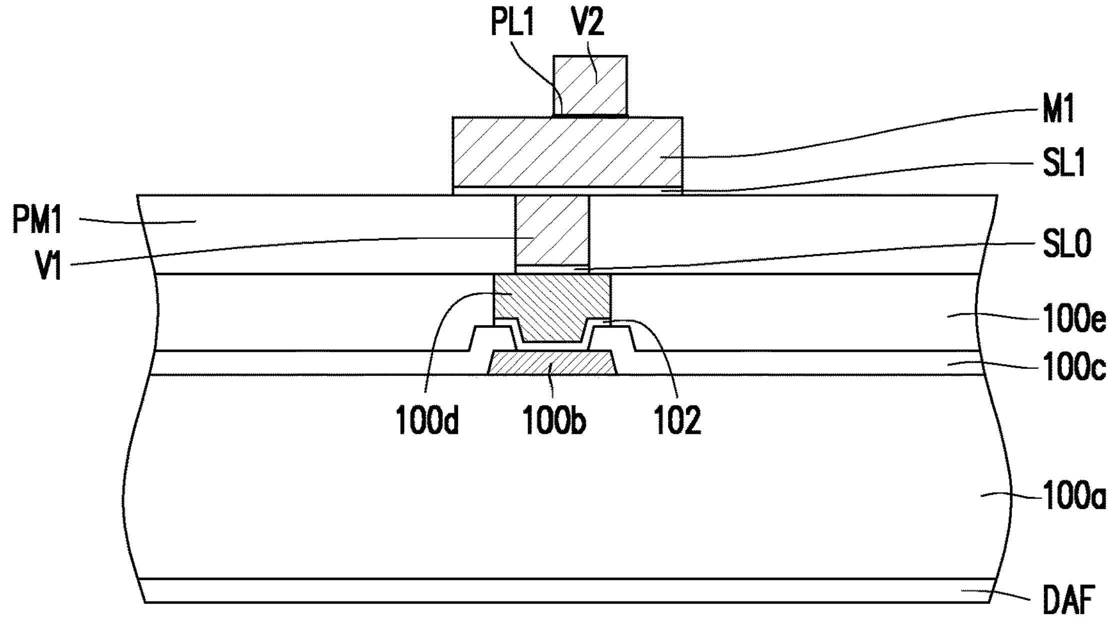

Referring to FIG. 2L, the photoresist layer PR2 and the underlying metal protection layer PL1 and the seed layer SL1 are removed. In some embodiments, the photoresist layer PR2 is removed, and then the metal protection layer PL1 and the seed layer SL1 are partially removed by using the metal line M1 and the metal via V2 as a mask. Therefore, the remaining seed layer SL1 is between the metal line M1 and each of the polymer layer PM1 and the metal via V1, and the remaining metal protection layer PL1 is between the metal via V2 and the metal line M1.

Figure 2M:
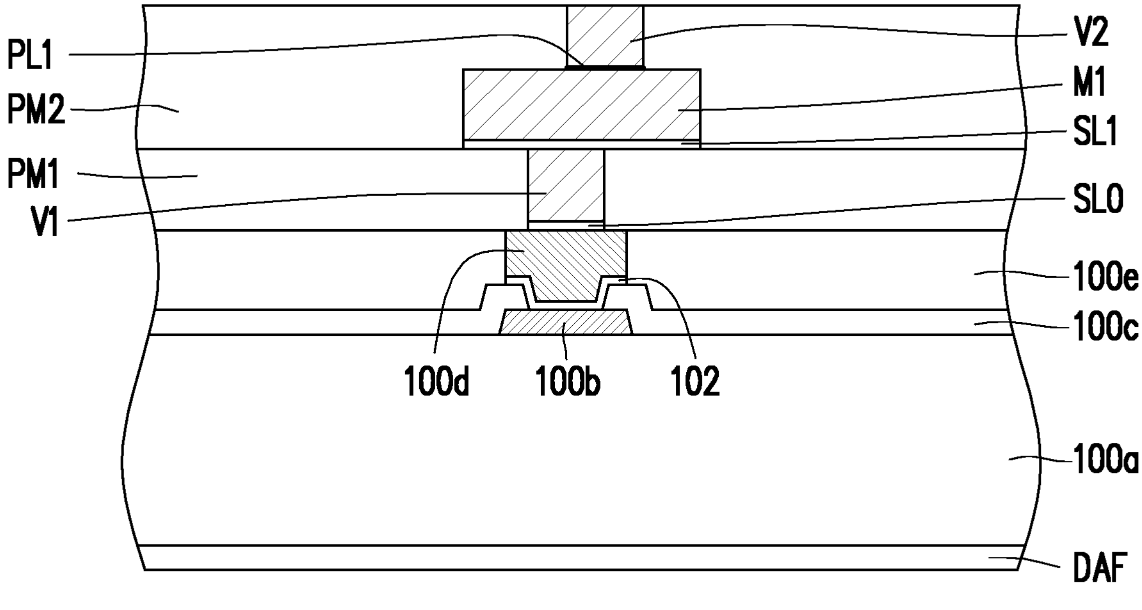

Referring to FIG. 2M, a polymer layer PM2 is formed over the polymer layer PM1 and surrounds the sidewalls of the seed layer SL1, the metal line M1, the metal protection layer PL1 and the metal via V2. In some embodiments, a polymer material is formed to cover the metal line M1 and the metal via V2, and a planarization process is performed to remove a portion of the polymer material until the metal line M1 is exposed. The top surface of the polymer layer PM2 is substantially coplanar with top surface of the metal via V2.

Figure 2N:
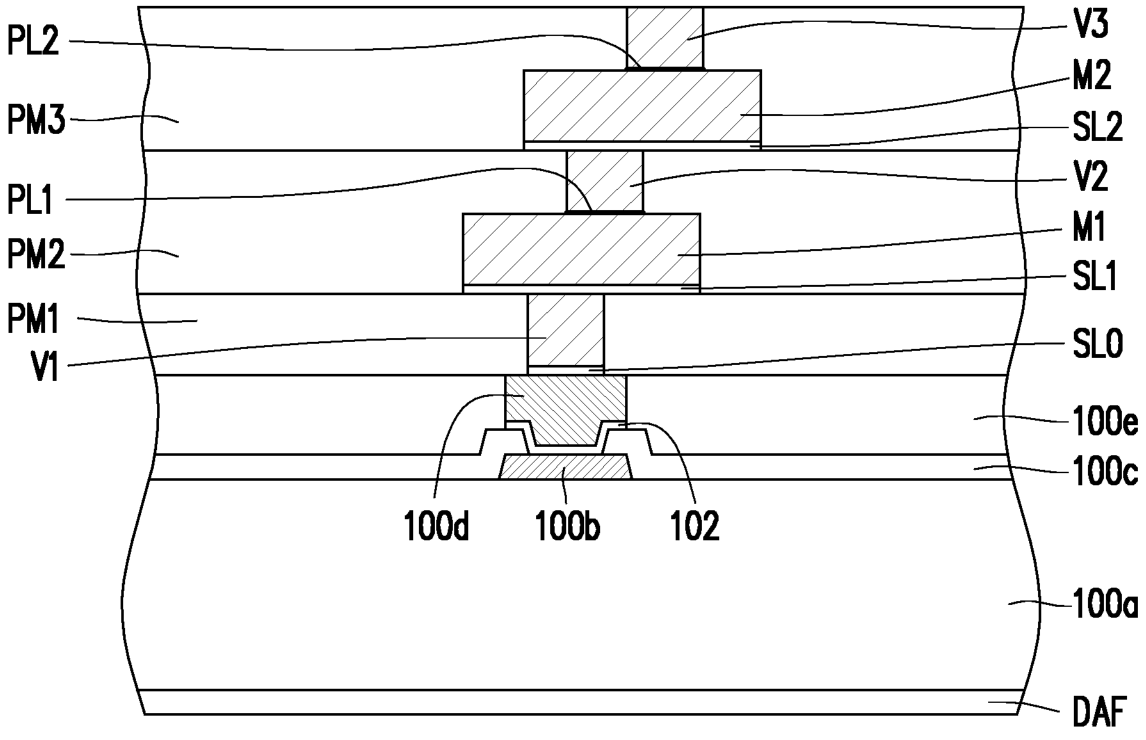
Figure 20:
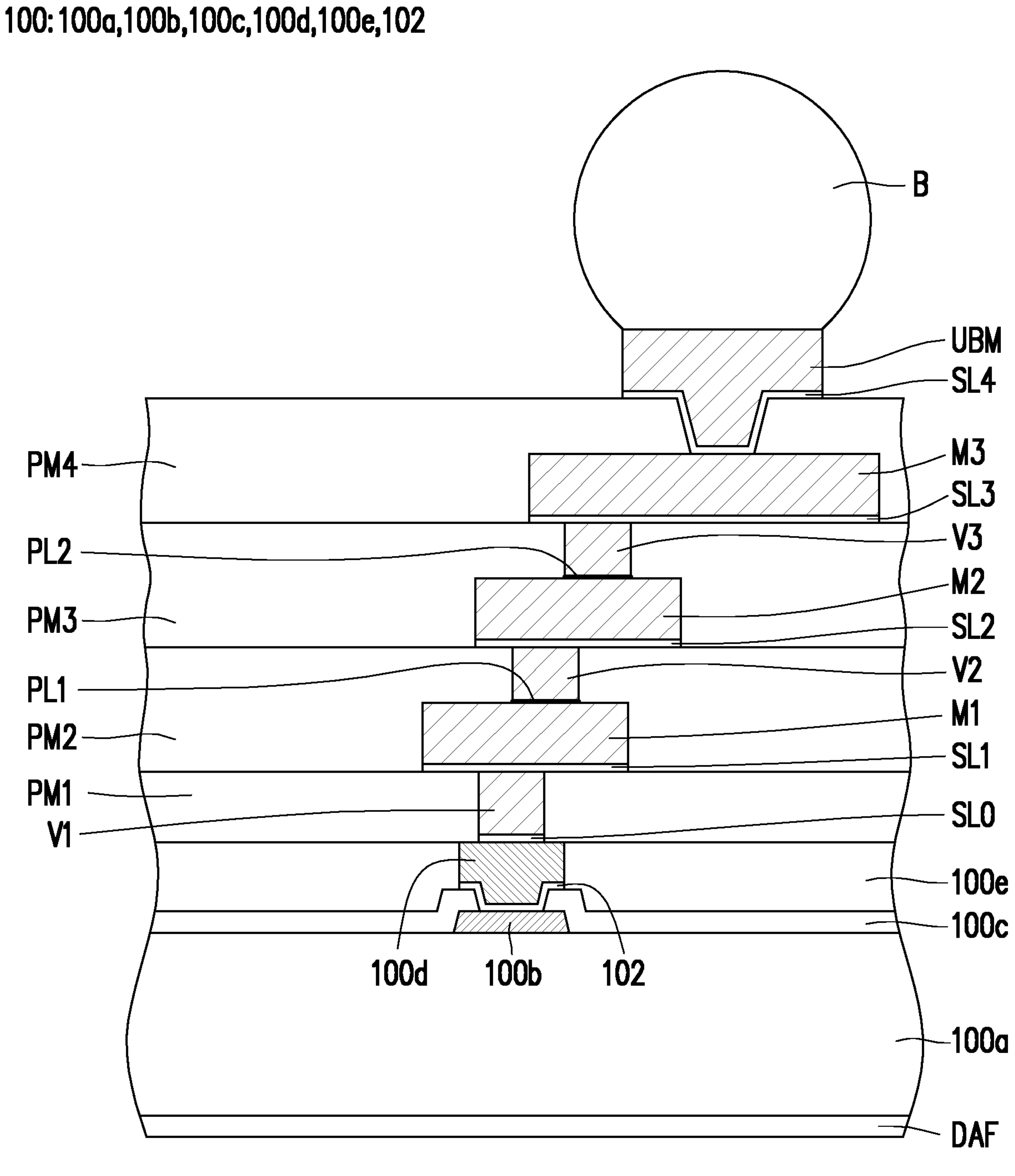

Referring to FIG. 2N, the operations similar to those in FIG. 2E to FIG. 2M are performed, so as to form a metal line M2 electrically connected to the metal via V2, a metal via V3 electrically connected to the metal line M2, and a polymer layer PM3 surrounding the metal line M2 and the metal via V3. In some embodiments, a seed layer SL2 is formed between the metal line M2 and each of the polymer layer PM2 and the metal via V2, and a metal protection layer PL2 is formed between the metal via V3 and the metal line M2. The operations in FIG. 2E to FIG. 2M may be repeated as many times as needed.

Referring to FIG. 2O, a metal line M3 is formed to electrically connect to the metal via V3, and a polymer layer PM4 is formed over the polymer layer PM3 and aside the metal line M3. In some embodiments, a seed layer SL3 is formed between the metal line M3 and each of the polymer layer PM3 and the metal via V3. Thereafter, an under bump metallization pad UBM is formed over and electrically connected to the metal line M3. In some embodiments, a seed layer SL4 is formed between the under bump metallization pad UBM and each of the polymer layer PM4 and the metal line M3. Afterwards, a bump B is formed on the under bump metallization pad UBM. A redistribution layer structure of this embodiment is thus completed.

The above embodiments in which the metal protection layer is formed by a single process (e.g., the operation on FIG. 2I) are provided for illustration purposes, and are not construed as limiting the present disclosure. In some embodiments, the metal protection layer may be formed by a multi-step process, which will be described in more detail later.

FIG. 3A to FIG. 3I are cross-sectional views showing a method of forming a conductive structure of a semiconductor package in accordance with alternative embodiments. The method of FIG. 3A to FIG. 3I is similar to the method of FIG. 2A to FIG. 2O, and the difference between them lies in the method of forming the metal protection layer. It may be noted that the difference between the embodiments will be described further in detail below, and the similarity are not iterated herein.

Figure 3A:
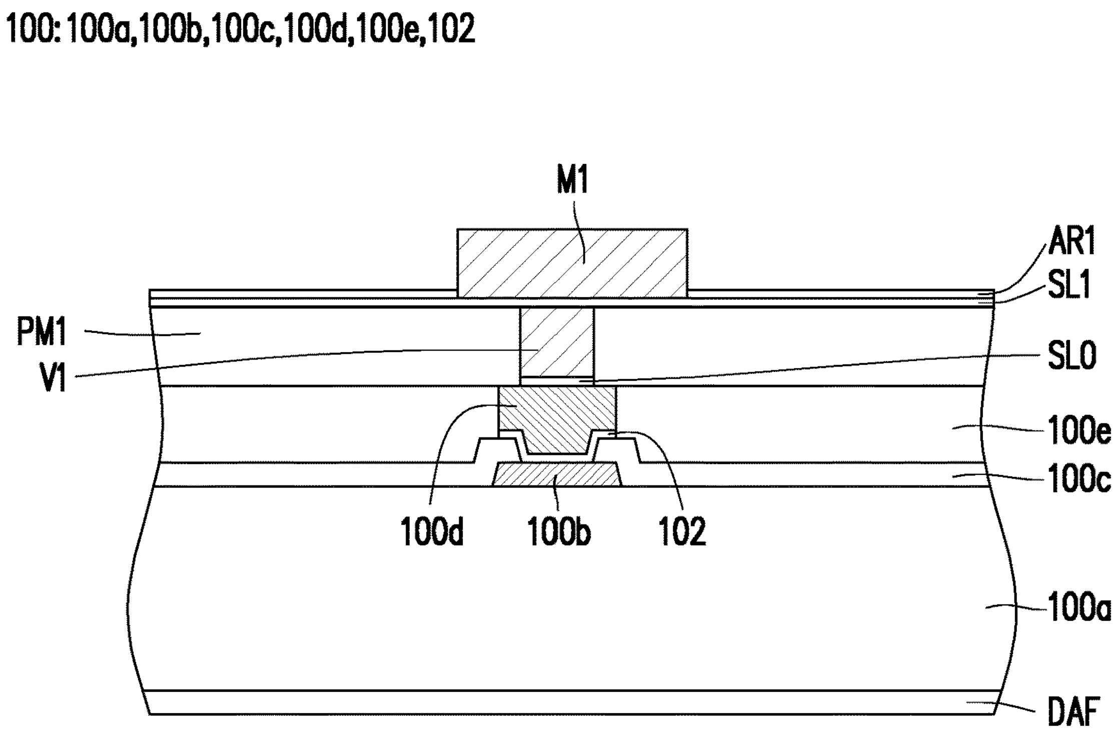
FIG. 3A to FIG. 3I are cross-sectional views showing a method of forming a conductive structure of a semiconductor package in accordance with alternative embodiments.

Referring to FIG. 3A, operations of FIG. 2A to FIG. 2G are performed, so as to obtain a structure similar to the structure of FIG. 2G. Specifically, a seed layer SL1 is formed over the polymer layer PM1, a metal line M1 is formed over the seed layer SL1, and a bottom anti-reflection coating layer AR1 is formed over the seed layer SL1 and aside the metal line M1.

Figure 3B:
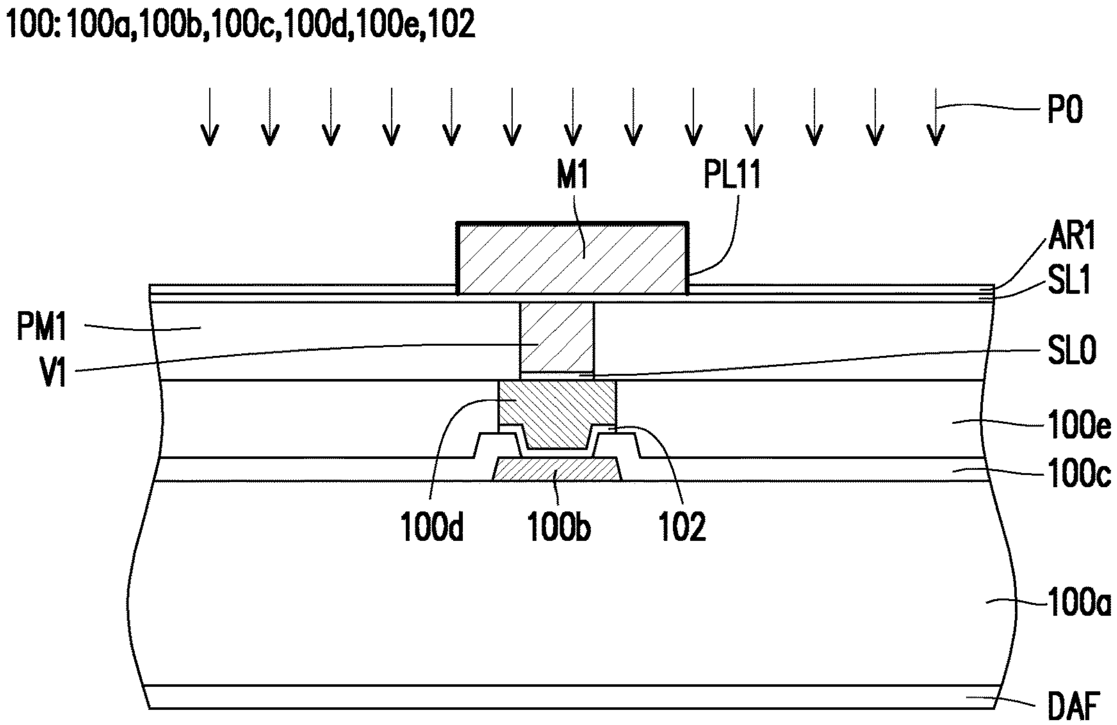

Referring to FIG. 3B, a metal protection layer PL11 is formed on the surface of the metal line M1. In some embodiments, the method of forming the metal protection layer PL11 includes performing a nitrogen-containing plasma P0. Specifically, since the seed layer SL1 aside the metal line M1 is shielded by the bottom anti-reflection coating layer AR1, the nitrogen-containing plasma P0 is performed to the metal line M1 only, and thus, the metal protection layer PL11 is formed on the top surface and the sidewall of the metal line M1.

In some embodiments, the nitrogen-containing plasma P0 includes $N_2$, $NH_3$, $NH_4$, NHx (wherein x is between 0 and 1), the like or combination thereof. In some embodiments, the nitrogen-containing plasma P0 is a pure nitrogen gas. In alternative embodiments, the nitrogen-containing ambient may be diluted with an inert gas such as, for example, argon (Ar), helium (He), neon (Ne), or a mixture thereof. In some embodiments, the amount of nitrogen is greater than the amount of argon, so as to effectively form the metal protection layer PL11. In some embodiments, the nitrogen-containing plasma P0 includes argon and nitrogen, and the volume ratio of argon to nitrogen ranges from about 1:1 to about 1:20. The nitrogen-containing plasma P0 of FIG. 3B is similar to the nitrogen-containing plasma P2 of FIG. 2I, and the description and possible range of the gas composition can refer to those of the nitrogen-containing plasma P2 of FIG. 2I, and the details are not iterated herein. Accordingly, the composition and thickness of the formed metal protection layer PL11 can refer to those of the metal protection layer PL1, and the details are not iterated herein.

Figure 3C:
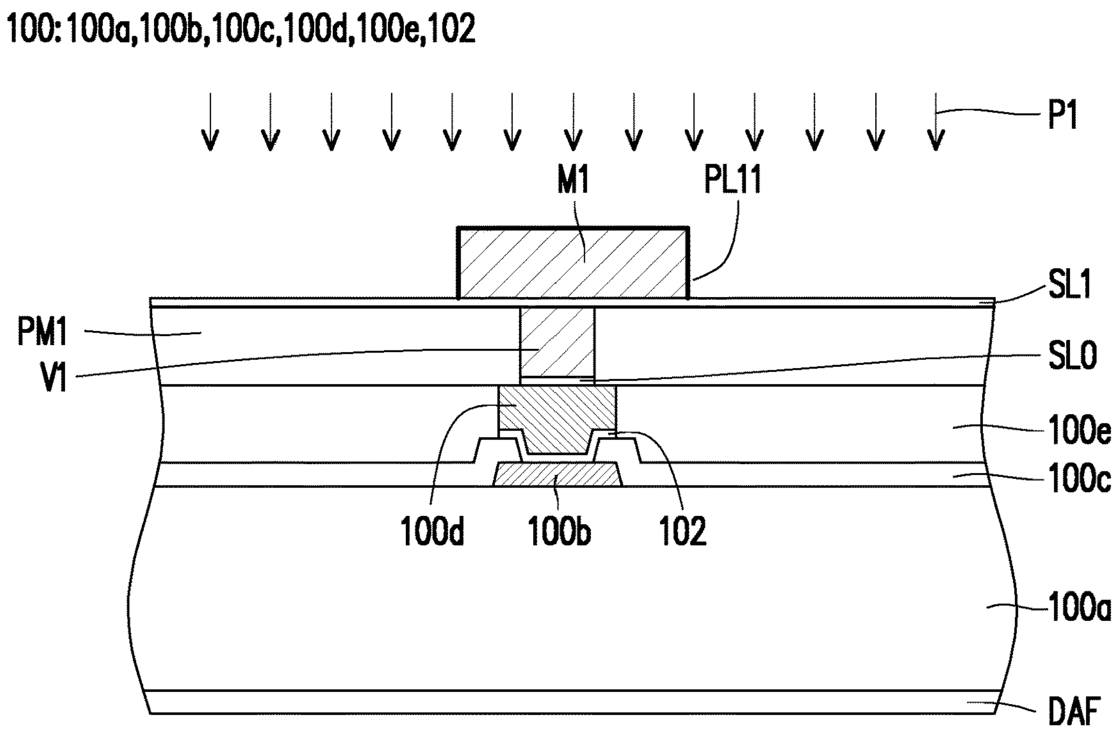

Referring to FIG. 3C, the bottom anti-reflection coating layer AR1 is removed. In some embodiments, the method of removing the bottom anti-reflection coating layer AR1 includes performing an oxygen-containing plasma P1. The oxygen-containing plasma includes oxygen ($O_2$), ozone ($O_3$), nitrous oxide ($N_2O$), the like or combination thereof. The oxygen-containing ambient may be diluted with an inert gas, such as argon (Ar), helium (He), neon (Ne), or a mixture thereof. In some embodiments, the amount of argon is greater than the amount of oxygen, so as to effectively remove the by-products and therefore prevent the underlying layer (e.g., metal line M1) from being damaged by the by-products. However, the present disclosure is not limited thereto. The amount of argon may be equal to or less than the amount of oxygen as needed. In some embodiments, the oxygen-containing plasma P1 includes argon and oxygen, and the volume ratio of argon to oxygen ranges from about 1:10 to about 10:1. The oxygen-containing plasma P1 of FIG. 3C is similar to the oxygen-containing plasma P1 of FIG. 2H, and the description and possible range of the gas composition can refer to those of the nitrogen-containing plasma P1 of FIG. 2H, and the details are not iterated herein.

Figure 3D:
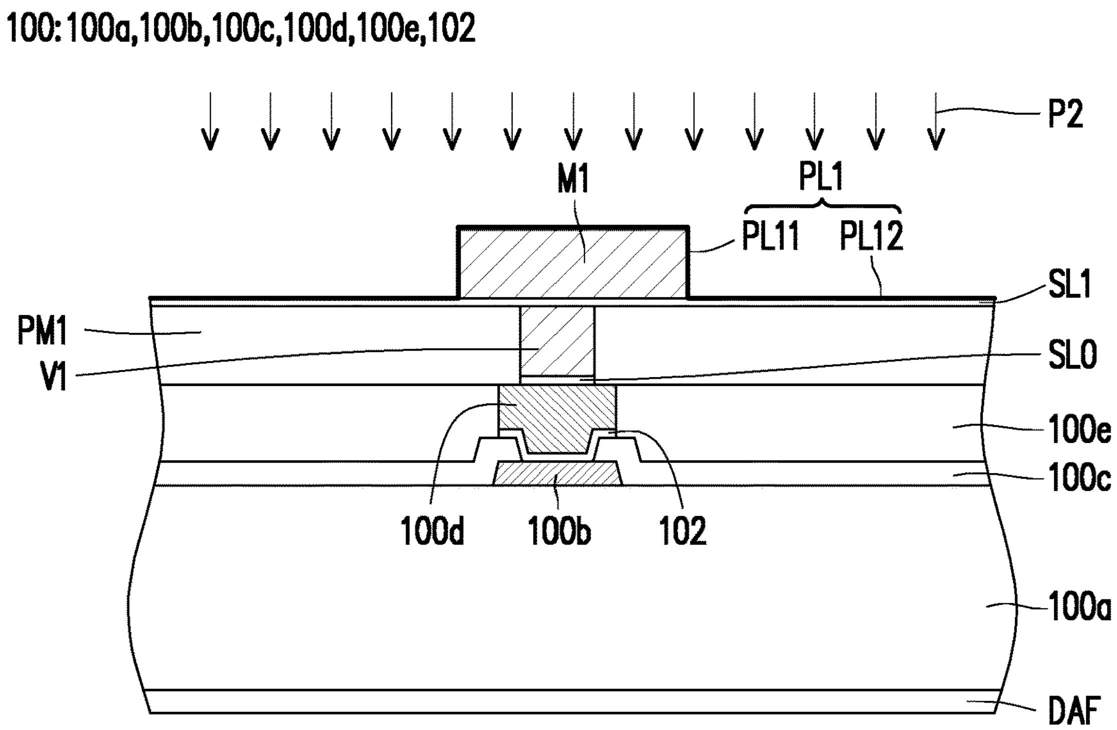

Referring to FIG. 3D, a metal protection layer PL12 is formed on the surface of the seed layer SL1. In some embodiments, the method of forming the metal protection layer PL12 includes performing a nitrogen-containing plasma P2. Specifically, since the metal line M1 is shielded by the metal protection layer PL11, the nitrogen-containing plasma P2 is performed to the seed layer SL1 aside the metal line M1 only, and thus, the metal protection layer PL12 is formed on the top surface of the seed layer SL1.

In some embodiments, the nitrogen-containing plasma P2 includes $N_2$, $NH_3$, $NH_4$, NHx (wherein x is between 0 and 1), the like or combination thereof. In some embodiments, the nitrogen-containing plasma P2 is a pure nitrogen gas. In alternative embodiments, the nitrogen-containing ambient may be diluted with an inert gas such as, for example, argon (Ar), helium (He), neon (Ne), or a mixture thereof. In some embodiments, the amount of nitrogen is greater than the amount of argon, so as to effectively form the metal protection layer PL12. In some embodiments, the nitrogen-containing plasma P2 includes argon and nitrogen, and the volume ratio of argon to nitrogen ranges from about 1:1 to about 1:20. The nitrogen-containing plasma P2 of FIG. 3D is similar to the nitrogen-containing plasma P2 of FIG. 2I, and the description and possible range of the gas composition can refer to those of the nitrogen-containing plasma P2 of FIG. 2I, and the details are not iterated herein. Accordingly, the composition and thickness of the formed metal protection layer PL12 can refer to those of the metal protection layer PL1, and the details are not iterated herein.

In some embodiments, the metal protection layer PL11 and the metal protection layer PL12 are connected to each other and together constitute a metal protection layer PL1. In some embodiments, the plasma parameters of forming the metal protection layer PL11 are the same as the plasma parameters of forming the metal protection layer PL12, but the disclosure is not limited thereto. In alternative embodiments, the plasma parameters of forming the metal protection layer PL11 may be different from the plasma parameters of forming the metal protection layer PL12.

Figure 3E:
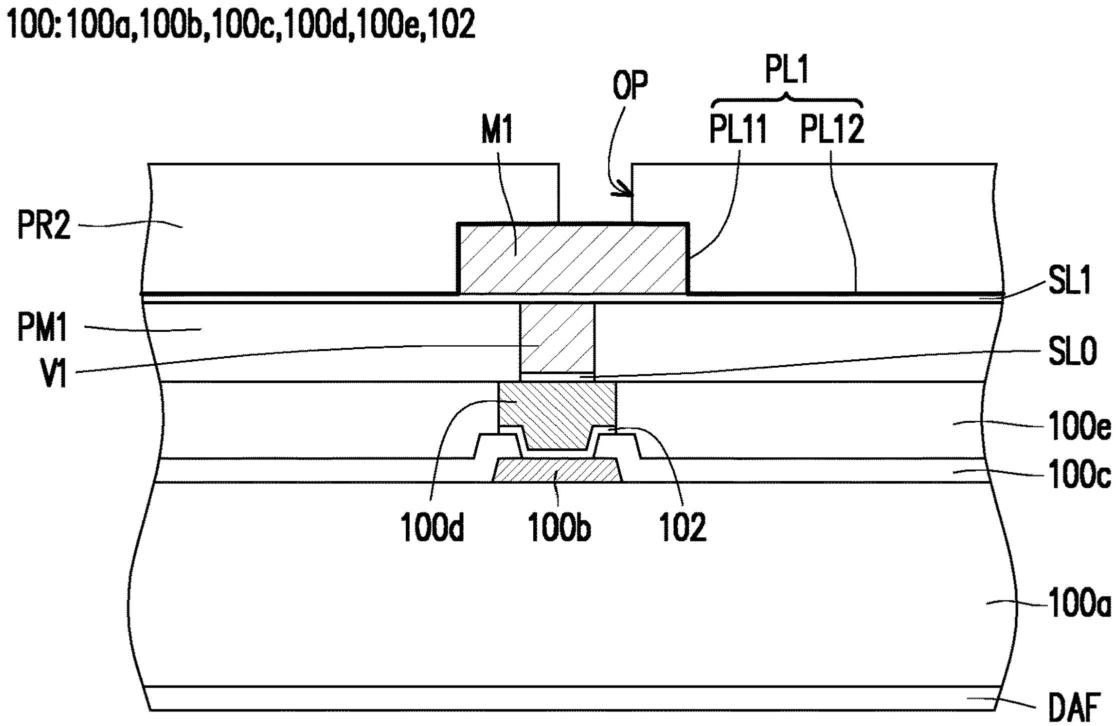

Referring to FIG. 3E, a photoresist layer PR2 is formed on the metal protection layer PL1. In some embodiments, the photoresist layer PR2 is a dry film resist (DFR) over the polymer layer PM1 and has an open area that exposes the intended location for the subsequently formed metal via V2. In some embodiments, the photoresist layer PR2 has at least one opening pattern OP that exposes a portion of the metal protection layer PL11 of the metal protection layer PL1.

Figure 3F:
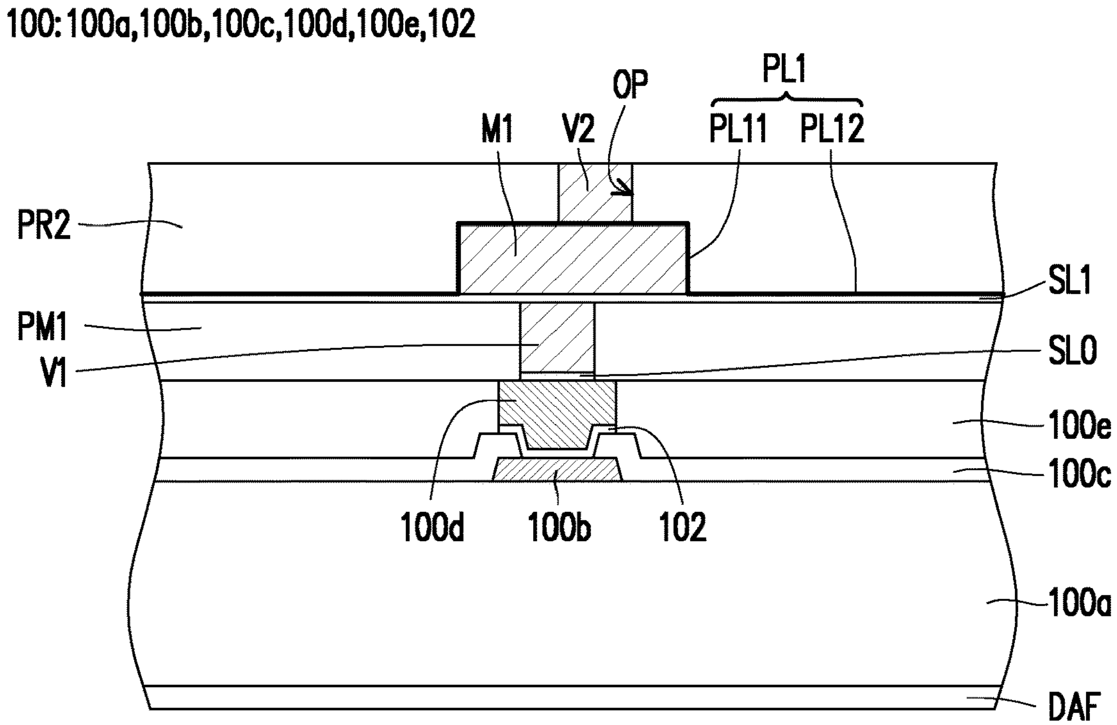

Referring to FIG. 3F, a metal via V2 is formed in the opening pattern OP of the photoresist layer PR2. The metal via V2 may include Cu. In some embodiments, an electroplating process is performed to form the metal via V2 by using the metal protection layer PL11 as a seed.

Figure 3G:
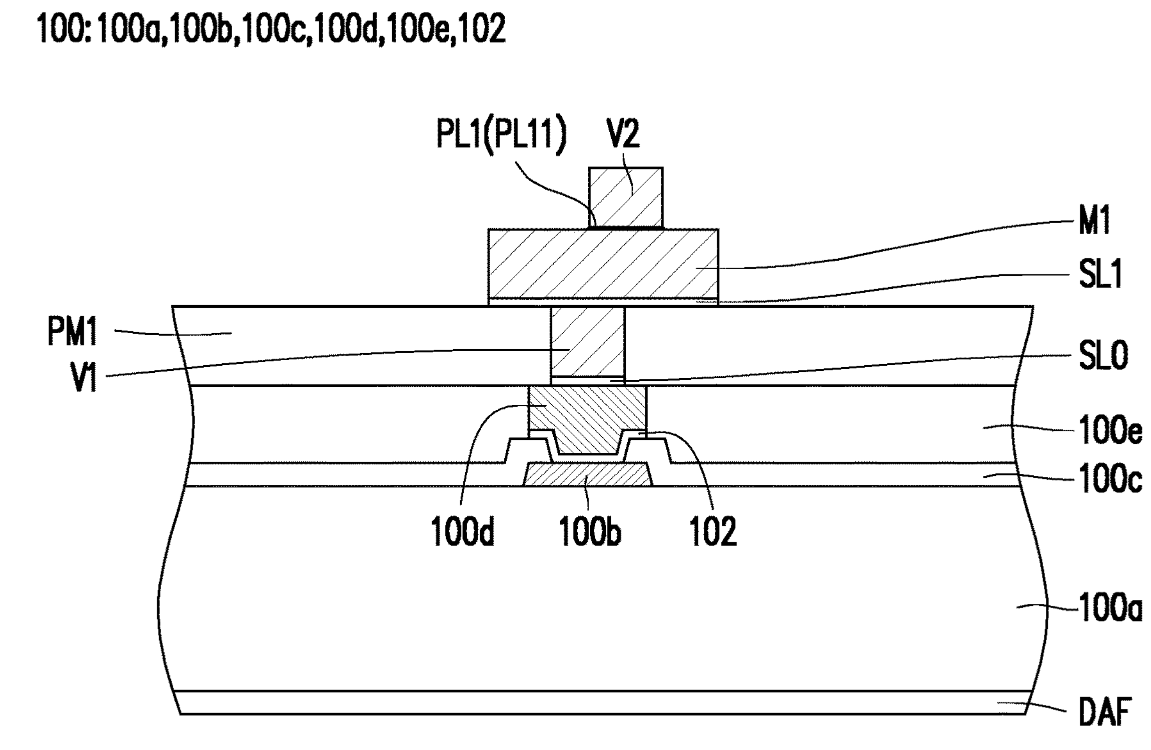

Referring to FIG. 3G, the photoresist layer PR2 and the underlying metal protection layer PL1 and the seed layer SL1 are removed. In some embodiments, the photoresist layer PR2 is removed. Thereafter, the metal line M1 and the metal via V2 are used as a mask, so as to partially remove the metal protection layer PL11, and remove the metal protection layer PL12 and the underlying seed layer SL1. Therefore, the remaining seed layer SL1 is between the metal line M1 and each of the polymer layer PM1 and the metal via V1, and the remaining metal protection layer PL11 is between the metal via V2 and the metal line M1.

Figure 3H:
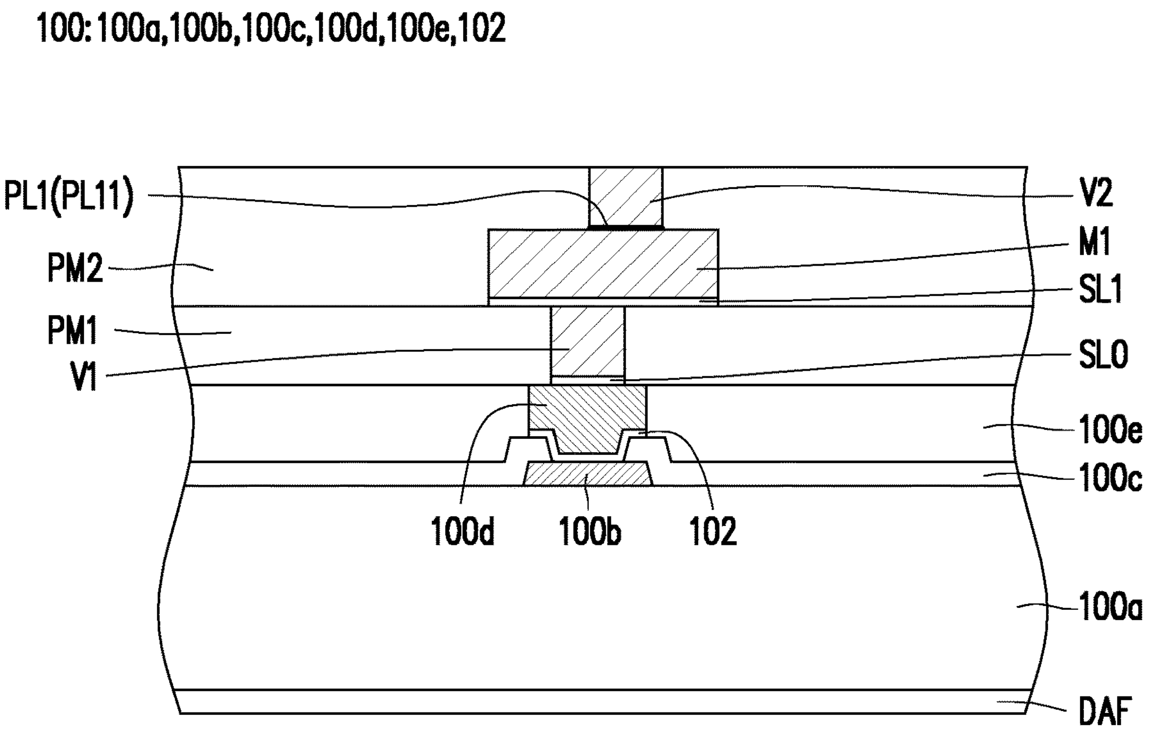

Referring to FIG. 3H, a polymer layer PM2 is formed over the polymer layer PM1, and surrounds the sidewalls of the seed layer SL1, the metal line M1, the metal protection layer PL11 and the metal via V2. In some embodiments, a polymer material is formed to cover the metal line M1 and the metal via V2, and a planarization process is performed to remove a portion of the polymer material until the metal line M1 is exposed. The top surface of the polymer layer PM2 is substantially coplanar with top surface of the metal via V2.

Figure 3I:
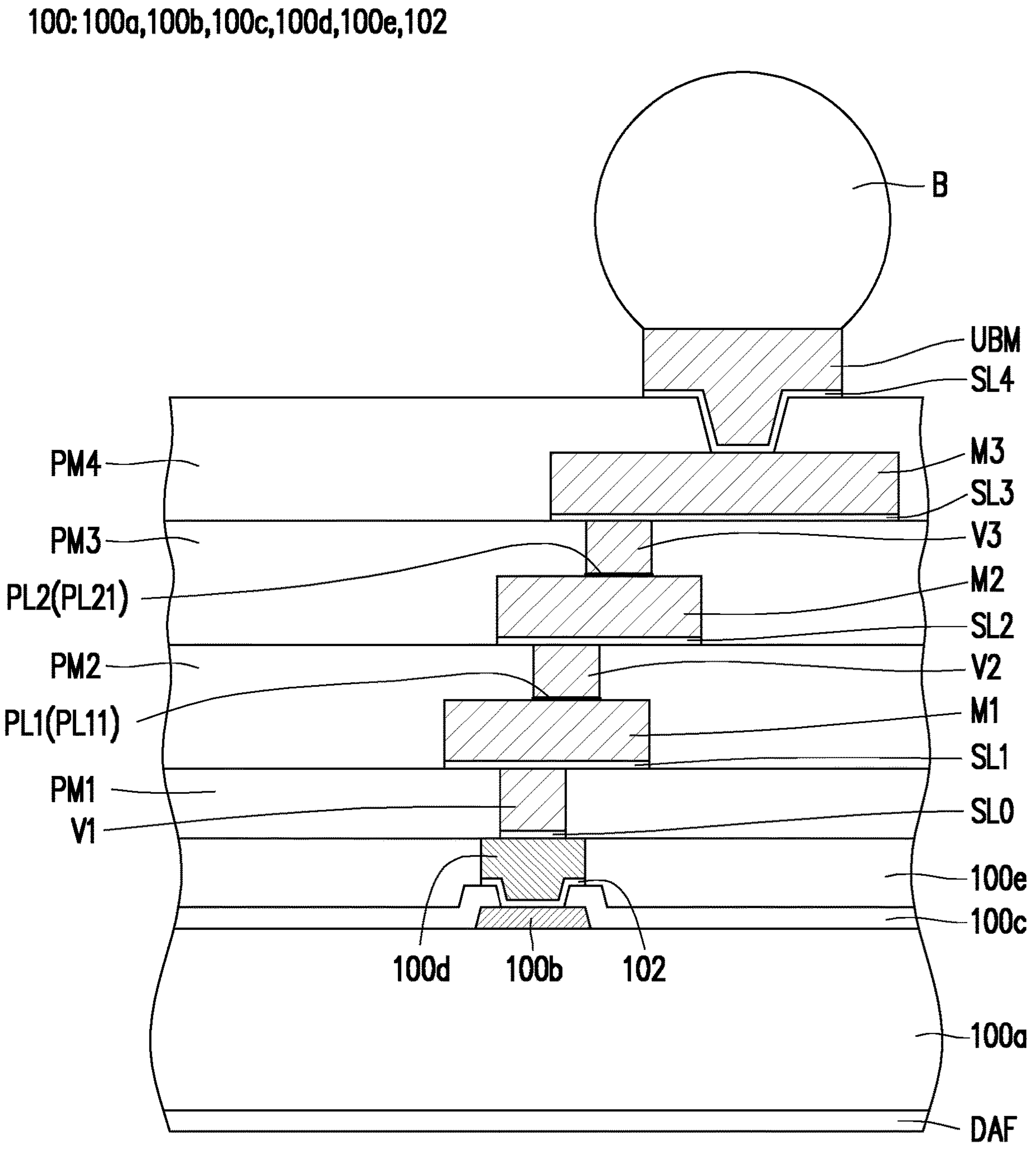

Referring to FIG. 3I, the operations similar to those in FIG. 3A to FIG. 3H are performed, so as to form a metal line M2 electrically connected to the metal via V2, a metal via V3 electrically connected to the metal line M2, and a polymer layer PM3 surrounding the metal line M2 and the metal via V3. In some embodiments, a seed layer SL2 is formed between the metal line M2 and each of the polymer layer PM2 and the metal via V2, and the metal protection layer PL2 or PL21 is formed between the metal via V3 and the metal line M2. The operations in FIG. 3A to FIG. 3H may be repeated as many times as needed.

Thereafter, a metal line M3 is formed to electrically connect to the metal via V3, and a polymer layer PM4 is formed over the polymer layer PM3 and aside the metal line M3. Thereafter, an under bump metallization pad UBM is formed over and electrically connected to the metal line M3. In some embodiments, a seed layer SL4 is formed between the under bump metallization pad UBM and each of the polymer layer PM4 and the metal line M3. Afterwards, a bump B is formed on the under bump metallization pad UBM. A redistribution layer structure of this embodiment is thus completed.

Figure 4:
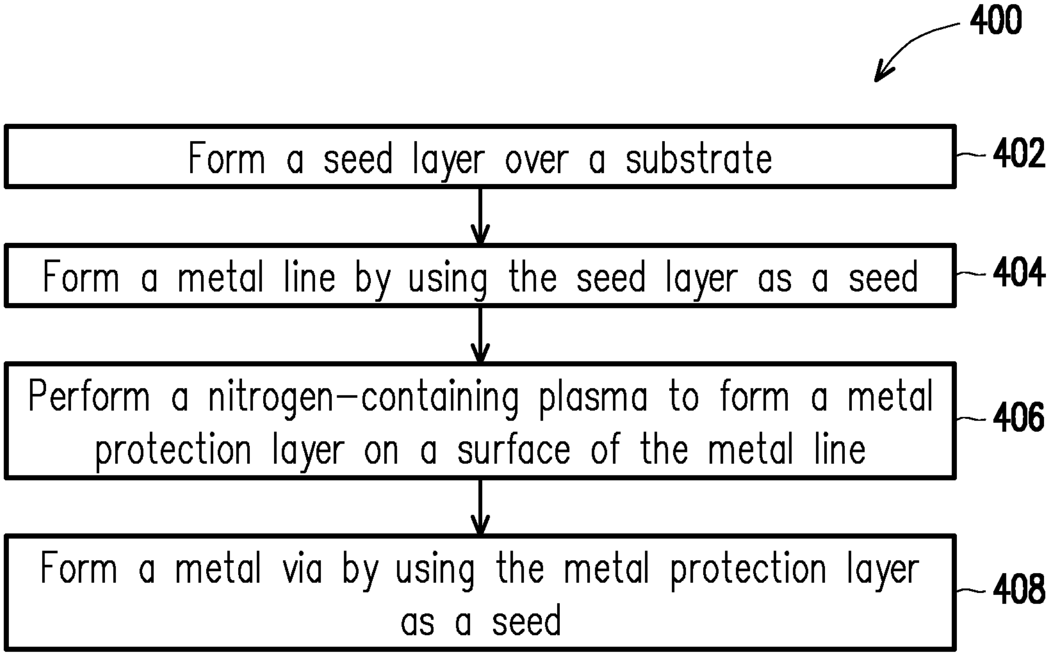
FIG. 4 illustrates a method of forming a conductive structure of a semiconductor package in accordance with some embodiments.

FIG. 4 illustrates a method 400 of forming a conductive structure of a semiconductor package in accordance with some embodiments. Although the method 400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 402, a seed layer is formed over a substrate. FIG. 2E illustrates a cross-sectional view corresponding to some embodiments of act 402. FIG. 3A illustrates a cross-sectional view corresponding to alternative embodiments of act 402.

At act 404, a metal line is formed by using the seed layer as a seed. FIG. 2E to FIG. 2H illustrate cross-sectional views corresponding to some embodiments of act 404. Specifically, FIG. 2E and FIG. 2H illustrate the following operations. A bottom anti-reflection coating layer is formed over the seed layer. A first photoresist layer is formed over the bottom anti-reflection coating layer, and the first photoresist layer has a trench pattern that exposes a portion of the bottom anti-reflection coating layer. The exposed portion of the bottom anti-reflection coating layer is removed, so that the trench pattern of the first photoresist layer exposes a portion of the seed layer. A metal line is formed in the trench pattern of the first photoresist layer by using the exposed seed layer as a seed. The first photoresist layer is removed. The bottom anti-reflection coating layer is removed by performing an oxygen-containing plasma after removing the first photoresist layer.

FIG. 3A illustrates a cross-sectional view corresponding to alternative embodiments of act 404. FIG. 3A illustrates the following operations. A first photoresist layer is formed over the bottom anti-reflection coating layer, and the first photoresist layer has a trench pattern that exposes a portion of the bottom anti-reflection coating layer. The exposed portion of the bottom anti-reflection coating layer is removed, so that the trench pattern of the first photoresist layer exposes a portion of the seed layer. A metal line is formed in the trench pattern of the first photoresist layer by using the exposed seed layer as a seed. The first photoresist layer is removed.

At act 406, a nitrogen-containing plasma is performed to form a metal protection layer on a surface of the metal line. FIG. 2I illustrates a cross-sectional view corresponding to some embodiments of act 406. Specifically, FIG. 2I illustrates performing the nitrogen-containing plasma after removing the bottom anti-reflection coating layer.

FIG. 3B to FIG. 3C illustrate cross-sectional views corresponding to alternative embodiments of act 406. Specifically, FIG. 3B and FIG. 3C illustrate the following operations. Specifically, FIG. 3B and FIG. 3C illustrate performing the nitrogen-containing plasma after removing the first photoresist layer and before removing the bottom anti-reflection coating layer. After the nitrogen-containing plasma, an oxygen-containing plasma is performed to remove the bottom anti-reflection coating layer aside the metal line. Another nitrogen-containing plasma (FIG. 3D) is optionally performed after the oxygen-containing plasma.

At act 408, a metal via is formed by using the metal protection layer as a seed. FIG. 2J to FIG. 2K illustrate cross-sectional views corresponding to some embodiments of act 408. FIG. 3E to FIG. 3F illustrate cross-sectional views corresponding to alternative embodiments of act 408.

The above embodiments in which the conductive structure is a part of a redistribution layer structure of semiconductor package are provided for illustration purposes, and are not construed as limiting the present disclosure. In alternative embodiments, the conductive structure is a part of an interconnect structure.

In view of the above, the method of the disclosure includes performing at least one nitrogen-containing plasma and at least one oxygen-containing plasma, by which the BARC material can be effectively removed without damaging the underlying metal feature, and a metal protection layer can be formed to protect the exposed metal feature. Accordingly, the metal damage is not observed, and the reliability of the device is improved.

Besides, the order and the number of the at least one nitrogen-containing plasma and at least one oxygen-containing plasma is not limited by the disclosure. In some embodiments, the method of the disclosure includes performing one oxygen-containing plasma (e.g., P1 in FIG. 2H) followed by one nitrogen-containing plasma (e.g., P2 in FIG. 2I). In alternative embodiments, the method of the disclosure includes sequentially performing one nitrogen-containing plasma (e.g., P0 in FIG. 3B), one oxygen-containing plasma (e.g., P1 in FIG. 3C) and another nitrogen-containing plasma (e.g., P2 in FIG. 3D). In yet alternative embodiments, the method of the disclosure includes a cyclic deposition and etching process in which multiple nitrogen-containing plasmas and multiple oxygen-containing plasma are performed alternately.

In accordance with some embodiments of the present disclosure, a conductive structure includes a metal feature, an insulating layer and a nitridized metal layer. The metal feature is disposed over a substrate and includes a lower metal pattern and an upper metal pattern over the lower metal pattern. The insulating layer surrounds the metal feature. The nitridized metal layer is disposed between the lower metal pattern and the upper metal pattern.

In accordance with alternative embodiments of the present disclosure, a semiconductor package includes at least one die and a redistribution layer structure. The redistribution layer structure is disposed over and electrically to the at least one die and includes at least one metal feature. In some embodiments, the at least one metal feature includes a lower seed layer, a metal line, an upper seed layer and a metal via sequentially stacked and embedded by a polymer layer, and the lower seed layer and the upper seed layer include different materials.

In accordance with yet alternative embodiments of the present disclosure, a method of forming a conductive structure includes the following operations. A seed layer is formed over a substrate. A metal line is formed by using the seed layer as a seed. A nitrogen-containing plasma is performed to form a metal protection layer on a surface of the metal line. A metal via is formed by using the metal protection layer as a seed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a redistribution layer structure, comprising:

forming a first metal via over a die and forming a first polymer layer around the first metal via;

forming a seed layer over the first metal via and the first polymer layer;

forming a bottom anti-reflection coating layer over the seed layer;

forming a first photoresist layer over the bottom anti-reflection coating layer, wherein the first photoresist layer has a trench pattern that exposes a portion of the bottom anti-reflection coating layer;

removing the exposed portion of the bottom anti-reflection coating layer, so that the trench pattern of the first photoresist layer exposes a portion of the seed layer;

forming a first metal line in the trench pattern of the first photoresist layer by using the exposed seed layer as a seed;

removing the first photoresist layer; and forming a first nitridized metal layer from a surface portion of the first metal line.

2. The method of claim 1, wherein forming the first nitridized metal layer comprises performing a nitrogen-containing plasma to the first metal line and the bottom anti-reflection coating layer aside the first metal line.

3. The method of claim 2, wherein the nitrogen-containing plasma comprises $N_2$, $NH_3$, $NH_4$, NHx, or a combination thereof.

4. The method of claim 1, further comprising performing an oxygen-containing plasma to remove the bottom anti-reflection coating layer aside the first metal line and therefore expose the underlying seed layer.

5. The method of claim 4, wherein the oxygen-containing plasma includes oxygen ($O_2$), ozone ($O_3$), nitrous oxide ($N_2O$), or a combination thereof.

6. The method of claim 4, further comprising, after performing the oxygen-containing plasma, performing a nitrogen-containing plasma to the seed layer aside the first metal line, so as to form a second nitridized metal layer from a surface portion of the seed layer, wherein the first nitridized metal layer and the second nitridized metal layer are in contact with each other;

forming a second photoresist layer over the first and second nitridized metal layers, wherein the second photoresist layer has an opening pattern that exposes a portion of the first nitridized metal layer;

forming a second metal via in the opening pattern of the second photoresist layer by using the exposed first nitridized metal layer as a seed; and removing the second photoresist layer.

7. The method of claim 6, further comprising removing a portion of the first nitridized metal layer, the second nitridized metal layer, and a portion of the seed layer below the second photoresist layer.

8. The method of claim 7, wherein an edge of the remaining first nitridized metal layer is aligned with an edge of the second metal via.

9. The method of claim 6, further comprising forming a second polymer layer around the first metal line and the second metal via.

10. A method of forming a redistribution layer, comprising:

forming a seed layer over a die;

forming a bottom anti-reflection coating layer over the seed layer;

forming a first photoresist layer over the bottom anti-reflection coating layer, wherein the first photoresist layer has a trench pattern that exposes a portion of the bottom anti-reflection coating layer;

removing the exposed portion of the bottom anti-reflection coating layer, so that the trench pattern of the first photoresist layer exposes a portion of the seed layer;

forming a metal line in the trench pattern of the first photoresist layer by using the exposed seed layer as a seed;

removing the first photoresist layer; and performing a nitrogen-containing plasma to the metal line and the bottom anti-reflection coating layer aside the metal line, so as to form a nitridized metal layer from a surface portion of the metal line.

11. The method of claim 10, further comprising, after performing the nitrogen-containing plasma, performing a descum process to remove the bottom anti-reflection coating layer aside the metal layer and therefore expose the underlying seed layer.

12. The method of claim 11, further comprising performing another nitrogen-containing plasma to the metal line and the exposed seed layer.

13. The method of claim 11, further comprising forming a metal via on the metal line by using the nitridized metal layer as a seed.

14. A method of forming a redistribution layer, comprising:

forming a seed layer over a die;

forming a metal line by using the seed layer as a seed;

performing a nitrogen-containing plasma to an entire top surface and entire sidewalls of the metal line, so as to form a metal protection layer from the entire top surface and the entire sidewalls of the metal line; and forming a metal via by using the metal protection layer as a seed.

15. The method of claim 14, wherein a method of forming the metal line comprises:

forming a bottom anti-reflection coating layer over the seed layer;

forming a first photoresist layer over the bottom anti-reflection coating layer, wherein the first photoresist layer has a trench pattern that exposes a portion of the bottom anti-reflection coating layer;

removing the exposed portion of the bottom anti-reflection coating layer, so that the trench pattern of the first photoresist layer exposes a portion of the seed layer;

forming the metal line in the trench pattern of the first photoresist layer by using the portion of the seed layer as a seed;

removing the first photoresist layer; and removing the bottom anti-reflection coating layer.

16. The method of claim 15, wherein the nitrogen-containing plasma is performed after removing the first photoresist layer and before removing the bottom anti-reflection coating layer.

17. The method of claim 16, wherein removing the bottom anti-reflection coating layer comprises performing an oxygen-containing plasma to remove the bottom anti-reflection coating layer aside the metal line.

18. The method of claim 17, further comprising performing another nitrogen-containing plasma after the oxygen-containing plasma.

19. The method of claim 18, wherein the another nitrogen-containing plasma comprises $N_2$, $NH_3$, $NH_4$, NHx, or a combination thereof.

20. The method of claim 17, wherein the oxygen-containing plasma includes oxygen ($O_2$), ozone ($O_3$), nitrous oxide ($N_2O$), or a combination thereof.

* * * * *